US012812875B2

(12) United States Patent
Lee et al.

(10) Patent No.: US 12,812,875 B2
(45) Date of Patent: Nov. 24, 2026

(54) MEMORY DEVICES

(71) Applicant: SAMSUNG ELECTRONICS CO., LTD., Suwon-si (KR)

(72) Inventors: Jinwoo Lee, Suwon-si (KR); Hyunchul Sohn, Suwon-si (KR); Jeongwoo Lee, Suwon-si (KR); Jaeyeon Kim, Suwon-si (KR); Kwangmin Park, Suwon-si (KR); Dongho Ahn, Suwon-si (KR); Jinmyung Choi, Suwon-si (KR)

(73) Assignees: Samsung Electronics Co., Ltd., Suwon-si (KR); UIF (UNIVERSITY—INDUSTRY FOUNDATION), YONSEI UNIVERSITY, Seoul (KR)

( * ) Notice: Subject to any disclaimer, the term of this patent is extended or adjusted under 35 U.S.C. 154(b) by 358 days.

(21) Appl. No.: 18/526,031

(22) Filed: Dec. 1, 2023

(65) Prior Publication Data

US 2024/0188305 A1 Jun. 6, 2024

(30) Foreign Application Priority Data

Dec. 2, 2022 (KR) ........................ 10-2022-0167034

(51) Int. Cl.
*H10B 63/00* (2023.01)
*H10B 63/10* (2023.01)

(52) U.S. Cl.
CPC ............. *H10B 63/22* (2023.02); *H10B 63/10* (2023.02); *H10B 63/80* (2023.02)

(58) Field of Classification Search
CPC ........ H10B 63/10; H10B 63/20; H10B 63/22; H10B 63/24; H10B 63/80; H10B 63/84;
(Continued)

(56) References Cited

U.S. PATENT DOCUMENTS 7,707,701 B2 5/2010 Iwashita et al.
7,889,539 B2 2/2011 Rinerson et al.
(Continued)

FOREIGN PATENT DOCUMENTS

KR 20190065980 A * 6/2019 ......... H01L 45/1253
KR 10-2049687 B1 11/2019
(Continued)

OTHER PUBLICATIONS

Office Action in Korean Appln. No. 10-2022-0167034, mailed on May 30, 2026, 10 pages (with English translation).

*Primary Examiner* — Dmitriy Yemelyanov
(74) *Attorney, Agent, or Firm* — Fish & Richardson P.C.

(57) ABSTRACT

A memory device includes a substrate; a plurality of first conductive lines on the substrate and extending in a first direction; a plurality of second conductive lines on the plurality of first conductive lines and extending in a second direction crossing the first direction; and a plurality of first memory cells respectively arranged between the plurality of first conductive lines and the plurality of second conductive lines, wherein each first memory cell of the plurality of first memory cells includes a switching device and a variable resistance material pattern, and the switching device includes a material having a composition of $La_xNi_{1-x}O_y$, in which $0.13 \le x \le 0.30$ and $0.9 \le y \le 1.5$.

20 Claims, 23 Drawing Sheets

(58) Field of Classification Search
CPC .... H10N 70/063; H10N 70/20; H10N 70/231; H10N 70/826; H10N 70/8833
See application file for complete search history.

(56) References Cited

U.S. PATENT DOCUMENTS

| | | | | |
|---|---|---|---|---|
| 8,569,104 | B2 | 10/2013 | Pham et al. | |
| 10,546,894 | B2 | 1/2020 | Wu et al. | |
| 11,088,203 | B2 | 8/2021 | Hsieh et al. | |
| 11,183,633 | B2 | 11/2021 | Sei et al. | |
| 11,430,951 | B2 | 8/2022 | Jiang et al. | |
| 2006/0213043 | A1* | 9/2006 | Iwashita | H10N 30/079 29/25.35 |
| 2010/0020133 | A1* | 1/2010 | Ohashi | B41J 2/14233 347/70 |
| 2017/0288140 | A1 | 10/2017 | Karpov et al. | |
| 2020/0335692 | A1* | 10/2020 | Seong | H10N 70/231 |
| 2021/0050522 | A1* | 2/2021 | Jung | G11C 13/0004 |
| 2021/0151505 | A1* | 5/2021 | Han | H10N 70/231 |
| 2021/0167286 | A1 | 6/2021 | Hong et al. | |

FOREIGN PATENT DOCUMENTS

| | | | |
|---|---|---|---|
| KR | 10-2081020 | B1 | 2/2020 |
| KR | 10-2021-0061071 | A | 5/2021 |
| KR | 10-2405553 | B9 | 6/2022 |

* cited by examiner

MEMORY DEVICES

CROSS-REFERENCE TO RELATED APPLICATION

This application is based on and claims priority under 35 U.S.C. § 119 to Korean Patent Application No. 10-2022-0167034, filed on Dec. 2, 2022, in the Korean Intellectual Property Office, the disclosure of which is incorporated by reference herein in its entirety.

BACKGROUND

1. Field

Embodiments relate to memory devices.

2. Description of the Related Art

As electronic products tend to be light, thin, short, and small, there is an increasing demand for high integration of memory devices. A memory device having a three-dimensional cross point structure in which memory cells are arranged at an intersection between two mutually intersecting electrodes has been considered.

SUMMARY

The embodiments may be realized by providing a memory device including a substrate; a plurality of first conductive lines on the substrate and extending in a first direction; a plurality of second conductive lines on the plurality of first conductive lines and extending in a second direction crossing the first direction; and a plurality of first memory cells respectively arranged between the plurality of first conductive lines and the plurality of second conductive lines, wherein each first memory cell of the plurality of first memory cells includes a switching device and a variable resistance material pattern, and the switching device includes a material having a composition of $La_xNi_{1-x}O_y$, in which $0.13 \leq x \leq 0.30$ and $0.9 \leq y \leq 1.5$.

The embodiments may be realized by providing a memory device including a substrate; a plurality of first conductive lines on the substrate and extending in a first direction; a plurality of second conductive lines on the plurality of first conductive lines and extending in a second direction crossing the first direction; and a plurality of first memory cells respectively between the plurality of first conductive lines and the plurality of second conductive lines, wherein each first memory cell of the plurality of first memory cells includes a switching device and a variable resistance material pattern, and the switching device includes a material having a composition of $La_xNi_{1-x}O_y$, in which $0.13 \leq x \leq 0.30$ and $0.9 \leq y \leq 1.5$, and has a NiO cubic crystal structure.

The embodiments may be realized by providing a memory device including a substrate; a peripheral circuit on the substrate; a plurality of first conductive lines on the substrate at a first vertical level higher than a vertical level of the peripheral circuit and extending in a first direction; a plurality of second conductive lines on the substrate at a second vertical level higher than the first vertical level, the plurality of second conductive lines extending in a second direction crossing the first direction; and a plurality of first memory cells respectively between the plurality of first conductive lines and the plurality of second conductive lines, wherein each first memory cell of the plurality of first memory cells includes a switching device and a variable resistance material pattern, and the switching device includes a material having a composition of $La_xNi_{1-x}O_y$, in which $0.13 \leq x \leq 0.30$ and $0.9 \leq y \leq 1.5$.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
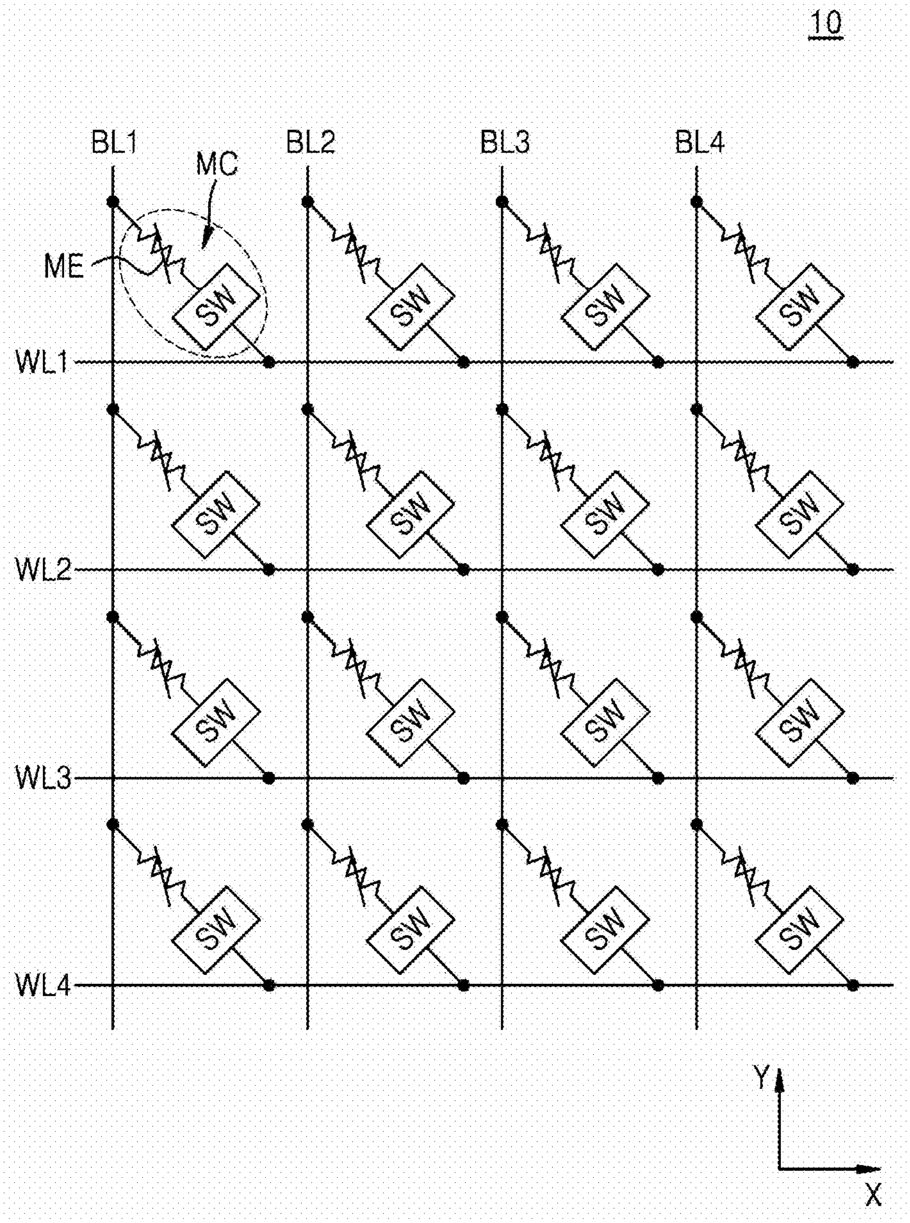
FIG. 1 is an equivalent circuit diagram of a memory device according to embodiments.

FIG. 1 is an equivalent circuit diagram of a memory device 10 according to embodiments.

Referring to FIG. 1, the memory device 10 may include a plurality of word lines WL1, WL2, WL3, and WL4 extending in a first direction (i.e., an X direction in FIG. 1) and a plurality of bit lines BL1, BL2, BL3, and BL4 extending in a second direction perpendicular to the first direction (i.e., a Y direction in FIG. 1). The plurality of memory cells MC may be connected to the plurality of word lines WL1, WL2, WL3, and WL4 and the plurality of bit lines BL1, BL2, BL3, and BL4, respectively. Each of the plurality of memory cells MC may include a variable resistance memory unit ME for storing information and a switching unit SW for selecting the memory cell. Meanwhile, the switching unit SW may be referred to as a selection element or an accessor element.

In an implementation, as the switching unit SW of each of the memory cells MC selected through the plurality of word lines WL1, WL2, WL3, and WL4 and the plurality of bit lines BL1, BL2, BL3, NS BL4 is turned on, a voltage may be applied to the variable resistance memory unit ME of the memory cell MC such that a current may flow in the variable resistance memory unit ME. In an implementation, the variable resistance memory unit ME may include a phase change material layer that may reversibly transition between a first state and a second state. In an implementation, each of the variable resistance memory units ME may include a suitable variable resistor whose resistance value varies depending on the applied voltage. In an implementation, depending on the voltage applied to the variable resistance memory unit ME of the selected memory cell MC, the resistance of the variable resistance memory unit ME may be reversibly shifted between the first state and the second state.

As the resistance of each of the variable resistance memory units ME changes, digital information such as "0" or "1" may be stored in each of the memory cells MC, and digital information may be erased from each of the memory cells MC. In an implementation, data may be written in a high resistance state "0" and a low resistance state "1" in each of the memory cells MC. In an implementation, each of the memory cells MC may store various resistance states.

According to the selection of word lines WL1, WL2, WL3, and WL4 and bit lines BL1, BL2, BL3, and BL4, any memory cell MC may be addressed. By applying predetermined signals between the word lines WL1, WL2, WL3, and WL4 and the bit lines BL1, BL2, BL3, and BL4, the memory cells MC may be programmed. By measuring the current values through the bit lines BL1, BL2, BL3, and BL4, information according to the resistance value of each of the variable resistance memory units ME constituting the corresponding memory cells may be read.

Figure 2:
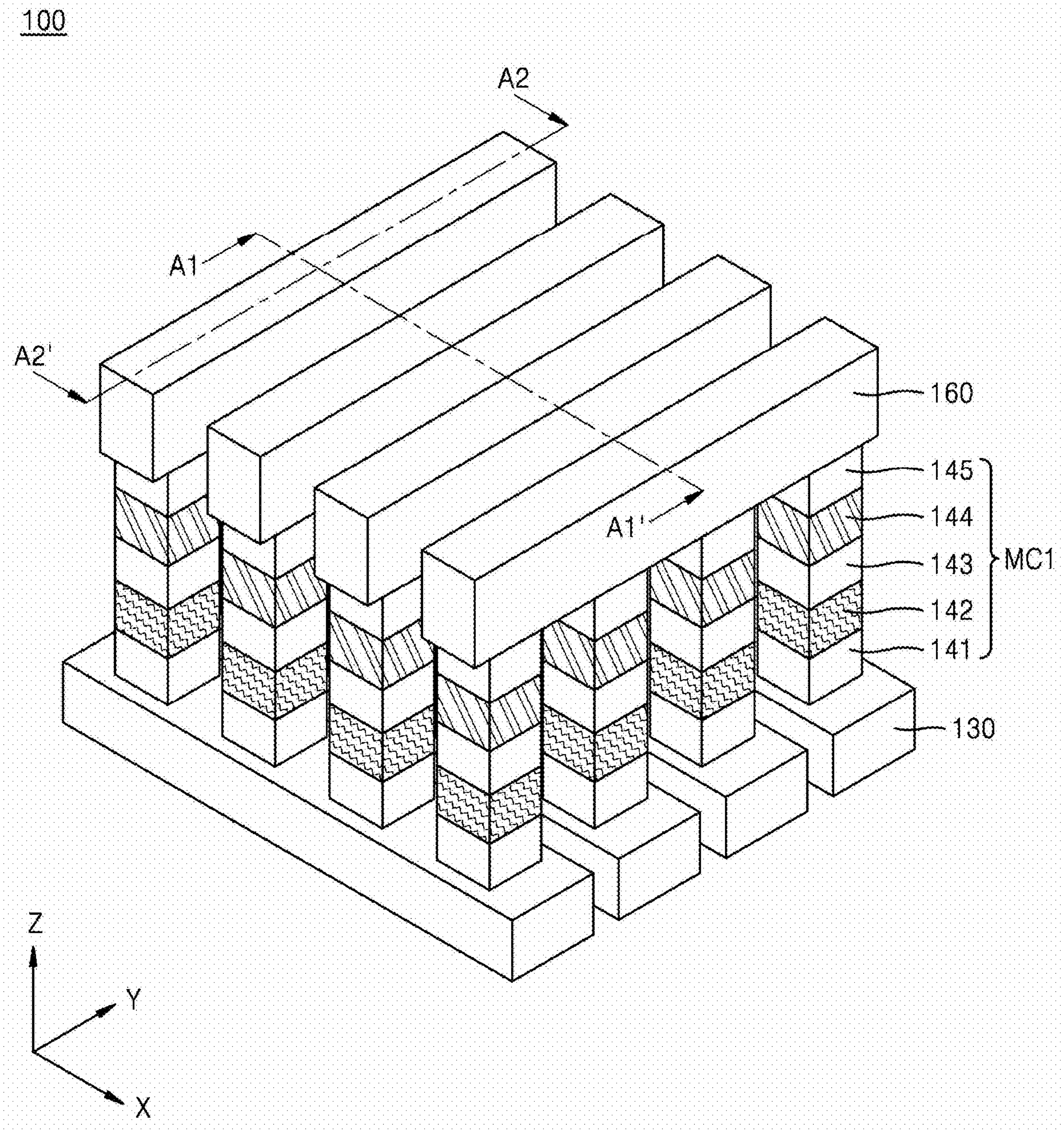
FIG. 2 is a perspective view illustrating a schematic configuration of a memory device according to embodiments.
Figure 3:
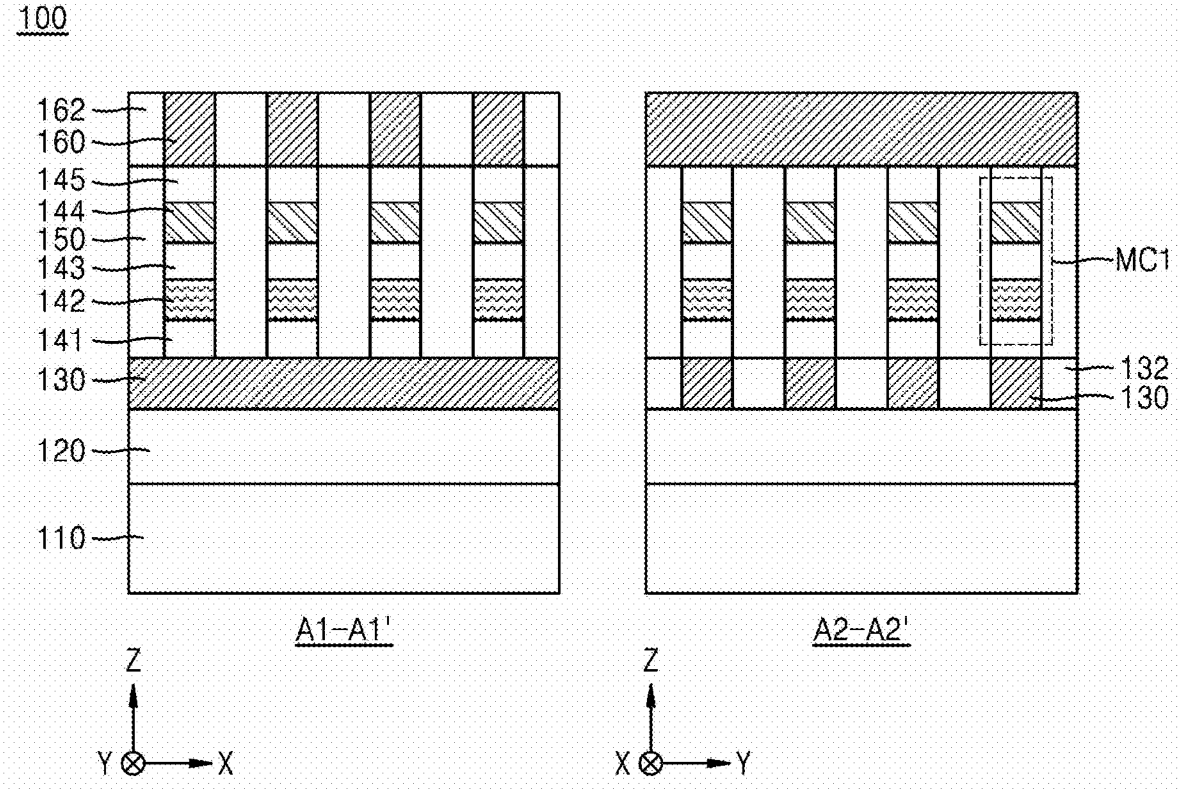
FIG. 3 illustrates cross-sectional views taken along lines A1-A1' and A2-A2' of FIG. 2.

FIG. 2 is a perspective view illustrating a schematic configuration of a memory device 100 according to embodiments. FIG. 3 illustrates cross-sectional views taken along lines A1-A1' and A2-A2' of FIG. 2.

Referring to FIGS. 2 and 3, the memory device 100 may include a plurality of first conductive lines 130, a plurality of second conductive lines 160, and a plurality of memory cells MC1, which are on a substrate 110.

In an implementation, a lower structure 120 may be between the substrate 110 and the plurality of first conductive lines 130. The lower structure 120 may include an insulating material that electrically insulates the plurality of first conductive lines 130 from the substrate 110. In an implementation, the lower structure 120 may include a peripheral circuit PTR (see FIG. 6) for driving a plurality of memory cells MC, and may further include, e.g., a wiring structure for electrically connecting the peripheral circuits PTR on the substrate 110 to the plurality of first conductive lines 130 and the plurality of second conductive lines 160.

The plurality of first conductive lines 130 may extend (e.g., lengthwise) parallel to each other in the first direction X, and the plurality of second conductive lines 160 may extend parallel to each other in the second direction Y crossing the first direction at a higher vertical level than the plurality of first conductive lines 130. Here, the vertical level may be defined based on a top surface of the substrate 110. In an implementation, the plurality of second conductive lines 160 may be at a vertical level higher than the plurality of first conductive lines 130, and this indicates that the distance from the plurality of second conductive lines 160 to the top surface of the substrate 110 may be greater than the distance from the plurality of first conductive lines 130 to the top surface of the substrate 110.

In view of a driving of the memory device 100, the plurality of first conductive lines 130 may correspond to the word lines WL1, WL2, WL3, and WL4 illustrated in FIG. 1, and the plurality of second conductive lines 160 may correspond to the bit lines BL1, BL2, BL3, and BL4. Conversely, the plurality of first conductive lines 130 may correspond to the bit lines BL1, BL2, BL3, and BL4 illustrated in FIG. 1, and the plurality of second conductive lines 160 may correspond to the word lines WL1, WL2, WL3, and WL4 illustrated in FIG. 1.

In an implementation, each of the plurality of first conductive lines 130 and each of the plurality of second conductive lines 160 may be formed of a metal, a conductive metal nitride, a conductive metal oxide, or a combination thereof. In an implementation, the plurality of first conductive lines 130 and the plurality of second conductive lines 160 may each be formed of, e.g., W, WN, Au, Ag, Cu, Al, TiAlN, Ir, Pt, Pd, Ru, Zr, Rh, Ni, Co, Cr, Sn, Zn, ITO, an alloy thereof, or a combination thereof. In an implementation, each of the plurality of first conductive lines 130 and each of the plurality of second conductive lines 160 may include a metal layer and a conductive barrier layer covering at least part of the metal layer. The conductive barrier layer may be made of, e.g., Ti, TiN, Ta, TaN, or a combination thereof. As used herein, the term "or" is not an exclusive term, e.g., "A or B" would include A, B, or A and B.

The plurality of memory cells MC1 may be between the plurality of first conductive lines 130 and the plurality of second conductive lines 160 and may extend to a predetermined height in a third direction Z perpendicular to the top surface of the substrate 110. In an implementation, the plurality of first conductive lines 130 may extend at the first vertical level in the first direction X, the plurality of second conductive lines 160 may extend at the second vertical level different from the first vertical level in the second direction Y, and the plurality of memory cells MC1 may be at intersections or overlapping positions of the plurality of first conductive lines 130 and the plurality of second conductive lines 160 in a plan view. The plurality of memory cells MC1 may be on the plurality of first conductive lines 130 and under the plurality of second conductive lines 160 and may be spaced apart from each other in the first direction X and the second direction Y. The arrangement of the plurality of memory cells MC1 may be referred to as a cross point type configuration. In an implementation, as illustrated in FIGS. 2 and 3, the memory device 100 may have a cross point type configuration of a first-layer stack in which the plurality of memory cells MC1 are arranged at the same vertical level.

Each of the plurality of memory cells MC1 may include a first electrode 141, a switching device 142, a second electrode 143, a variable resistance material pattern 144, and a third electrode 145, which may be sequentially on each of the plurality of first conductive lines 130 in the third direction Z. In an implementation, a barrier layer may be further included between the second electrode 143 and the variable resistance material pattern 144, or between the variable resistance material pattern 144 and the third electrode 145. The barrier layer may be made of or include, e.g., tungsten nitride (WN), tungsten carbide (WC), or a combination of it.

In an implementation, the first electrode 141, the second electrode 143, and the third electrode 145 may each independently include, e.g., W, Ti, Ta, Al, Cu, C, CN, TiN, TiAlN, TiSiN, TiCN, TiCSiN, WN, CoSiN, WSiN, TaN, TaCN, or TaSiN.

The switching device 142 may function as a current adjusting layer capable of controlling the flow of current, and may correspond to the switching unit SW illustrated in FIG. 1. The switching device 142 may include a material layer whose resistance may change according to the magnitude of a voltage applied across both ends of the switching device 142. The switching device 142 may have a large resistance in an off state and a small resistance in an on state, and when a voltage higher than or equal to a threshold voltage is applied to the switching device 142, a relatively large current may flow through the switching device 142.

In an implementation, the switching device 142 may include a transition metal oxide having a Mott transition characteristic. In an implementation, the switching device may include, e.g., a material having a composition of or represented by $La_xNi_{1-x}O_y$, in which $0.13 \le x \le 0.30$ and $0.9 \le y \le 1.5$. Here, the Mott transition characteristic may refer to a phenomenon in which an energy band change of a material is induced by an application of an electric field to increase or decrease conductivity, and thus the material is transferred from insulating nature to metallicity or from metallicity to insulating nature.

In an implementation, the material of the switching device 142 may have a NiO cubic structure and may exhibit a (111) peak at 37.26±0.2°, a (200) peak at 43.29±0.2°, and a (220) peak at 62.88±0.2° in the X-ray diffraction analysis graph. The (111) peak may be originated or derived from (111) crystal plane of the NiO cubic structure (e.g., NiO cubic crystal structure), the (200) peak may be originated or derived from (200) crystal plane of the NiO cubic structure, and the (220) peak may be originated or derived from (220) crystal plane of the NiO cubic structure. In an implementation, the switching device 142 may have a structure in which a part of nickel atoms is substituted with lanthanum atoms based on a NiO cubic structure, and as the lanthanum content (e.g., x value) increases, the positions of the peaks originated from (111), (200), and (220) planes in the X-ray diffraction analysis graph may be shifted by a predetermined angle from reference positions.

In an implementation, the switching device 142 may include a material having a NiO cubic structure with a composition of $La_xNi_{1-x}O_y$, in which $0.13 \le x \le 0.30$ and $0.9 \le y \le 1.5$. The valence state of the nickel atom may be changed from $2^+$ to $3^+$ due to oxygen vacancy in the switching device 142. The insulator-metal transition characteristics may appear due to the change in the energy band structure of $La_xNi_{1-x}O_y$.

In an implementation, the nickel content, lanthanum content, and oxygen content of the switching device 142 may be measured by an analysis method such as Rutherford backscattering spectrometry (RBS) or inductively coupled plasma-mass spectrometry (ICP-MS). In an implementation, the ratio of the content of lanthanum to the content of nickel may be obtained by RBS analysis or ICP-MS analysis. In an implementation, in the chemical formula of lanthanum nickel oxide, the content of lanthanum (i.e., x) may range from 0.13 to 0.30, the content of nickel (i.e., 1−x) may range from 0.70 to 0.87, and the content of oxygen (i.e., y) may range from 0.9 to 1.5.

In an implementation, the content of lanthanum may be 0.13 to 0.30, and the switching device 142 may not need an initial forming process. In an implementation, even if the switching device 142 does not undergo an initial forming process, the switching device 142 may exhibit stable switching behavior within this composition range. In an implementation, as described in detail below with reference to FIG. 17, the first voltage sweep behavior of the switching device 142 may be substantially similar to the second voltage sweep behavior in the as-deposited state (even if no separate forming process or voltage application process is performed on the switching device 142 after deposition).

In an implementation, the switching device 142 may not require an initial forming process, and formation of a random conductive path inside the switching device 142 by application of a high voltage may be prevented, thereby preventing degradation of durability. Accordingly, the switching device 142 may exhibit improved durability and reliability.

In an implementation, the lanthanum content may be 0.13 to 0.30, and the switching device 142 may function as a switching function having a relatively high switching speed. In an implementation, as described below with reference to FIGS. 18A to 18C, it may be seen that the switching device 142 according to the embodiments may have a switching time of approximately 200 nanoseconds, and a fast switching speed, and that the on-state resistance and the off-state resistance may be uniformly maintained in $10^9$-times cycle tests.

In contrast, as described below with reference to FIG. 16A, a switching device according to a Comparative Example (e.g., with a composition of NiO) with a lanthanum content less than 0.13 may require a forming process or may not function as a reversible switching device even if the forming process is performed.

In an implementation, the variable resistance material pattern 144 may include a phase change material that reversibly changes between an amorphous state and a crystalline state according to a heating time. In an implementation, the variable resistance material pattern 144 may include a material whose phase may be reversibly changed by Joule heat generated by a voltage applied across both ends of the variable resistance material pattern 144, and whose resistance may be changed by such a phase change. In an implementation, the phase change material may become a high resistance state in an amorphous phase and a low resistance state in a crystalline phase. Data may be stored in the variable resistance material pattern 144 by defining the high resistance state as '0' and the low resistance state as '1'.

In an implementation, the variable resistance material pattern 144 may be a single layer or a multilayer, and may include, e.g., a two-component material or binary material such as GeTe, GeSe, GeS, SbSe, SbTe, SbS, SbSe, SnSb, InSe, InSb, AsTe, AlTe, GaSb, AlSb, BiSb, ScSb, Ysb, CeSb, DySb, or NdSb, a three-component material or ternary material such as GeSbSe, AlSbTe, AlSbSe, SiSbSe, SiSbTe, GeSeTe, InGeTe, GeSbTe, GeAsTe, SnSeTe, GeGaSe, BiSbSe, GaSeTe, InGeSb, GaSbSe, GaSbTe, InSbSe, InSbTe, SnSbSe, SnSbTe, ScSbTe, ScSbSe, ScSbS, YSbTe, YSbSe, YSbS, CeSbTe, CeSbSe, CeSbS, DySbTe, DySbSe, DySbS, NdSbTe, NdSbSe, or NdSbS, a four-component material or quaternary material such as GeSbTeS, BiSbTeSe, AgInSbTe, GeSbSeTe, GeSnSbTe, SiGeSbTe, SiGeSbSe, SiGeSeTe, BiGeSeTe, BiSiGeSe, BiSiGeTe, GeSbTeBi, GeSbSeBi, GeSbSeIn, GeSbSeGa, GeSbSeAl, GeSbSeT1, GeSbSeSn, GeSbSeZn, GeSbTeIn, GeSbTeGa, GeSbTeAl, GeSbTeTl, GeSbTeSn, GeSbTeZn, ScGeSbTe, ScGeSbSe, ScGeSbS, YGeSbTe, YGeSbSe, YGeSbS, CeGeSbTe, CeGeSbSe, CeGeSbS, DyGeSbTe, DyGeSbSe, DyGeSbS, NdGeSbTe, NdGeSbSe, or NdGeSbS, or a five-component material such as InSbTeAsSe, GeScSbSeTe, GeSbSeTeS, GeScSbSeS, GeScSbTeS, GeScSeTeS, GeScSbSeP, GeScSbTeP, GeSbSeTeP, GeScSbSeIn, GeScSbSeGa, GeScSbSeAl, GeScSbSeTl, GeScSbSeZn, GeScSbSeSn, GeScSbTeIn, GeScSbTeGa, GeSbAsTeAl, GeScSbTeTl, GeScSbTeZn, GeScSbTeSn, GeSbSeTeIn, GeSbSeTeGa, GeSbSeTeAl, GeSbSeTeTl, GeSbSeTeZn, GeSbSeTeSn, GeSbSeSIn, GeSbSeSGa, GeSbSeSAl, GeSbSeSTl, GeSbSeSZn, GeSbSeSSn, GeSbTeSIn, GeSbTeSGa, GeSbTeSAl, GeSbTeSTl, GeSbTeSZn, GeSbTeSSn, GeSbSeInGa, GeSbSeInAl, GeSbSeInTl, GeSbSeInZn, GeSbSeInSn, GeSbSeGaAl, GeSbSeGaTi, GeSbSeGaZn, GeSbSeGaSn, GeSbSeAlTi, GeSbSeAlZn, GeSbSeAlSn, GeSbSeTlZn, GeSbSeTlSn, or GeSbSeZnSn.

In an implementation, the variable resistance material pattern 144 may include a two- to five-component material described above as a constituent material of the variable resistance material pattern 144, and at least one additional element, e.g., B, C, N, O, P, Cd, W, Ti, Hf, or Zr.

In an implementation, the variable resistance material pattern 144 may include various materials having resistance change characteristics.

In an implementation, when the variable resistance material pattern 144 includes a transition metal oxide, the memory device 100 may be a Resistive RAM (ReRAM). In the variable resistance material pattern 144 including the transition metal oxide, at least one electrical passage may be created or extinguished in the variable resistance material pattern 144 by program operation. When the electrical passage is generated, the variable resistance material pattern 144 may have a low resistance value, and when the electrical passage is extinguished or removed, the variable resistance material pattern 144 may have a high resistance value. The memory device 100 may store data by using the difference in resistance values of the variable resistance material pattern 144.

When the variable resistance material pattern 144 is formed of a transition metal oxide, the transition metal oxide may include, e.g., Ta, Zr, Ti, Hf, Mn, Y, Ni, Co, Zn, Nb, Cu, Fe, or Cr. In an implementation, the transition metal oxide may be a single layer or a multilayer, and may include, e.g., $Ta_2O_{5-x}$, $ZrO_{2-x}$, $TiO_{2-x}$, $HfO_{2-x}$, $MnO_{2-x}$, $Y_2O_{3-x}$, $NiO_{1-y}$, $Nb_2O_{5-x}$, $CuO_{1-y}$, or $Fe_2O_{3-x}$. In the materials, x and y may satisfy the following relations $0 \le x \le 1.5$ and $0 \le y \le 0.5$.

In an implementation, when the variable resistance material pattern 144 has a magnetic tunnel junction (MTJ) structure including two electrodes made of a magnetic material and a dielectric placed between the two magnetic electrodes, the memory device 100 may be a magnetic RAM (MRAM).

The two electrodes may be a magnetization pinned layer and a magnetization free layer, respectively, and the dielectric therebetween may be a tunnel barrier layer. The magnetization pinned layer may have a magnetization direction fixed in one direction, and the magnetization free layer may have a magnetization direction that may be changed to be parallel or semi-parallel to the magnetization direction of the magnetization pinned layer. Magnetization directions of the magnetization pinned layer and the magnetization free layer may be parallel to one surface of the tunnel barrier layer. Magnetization directions of the magnetization pinned layer and the magnetization free layer may be perpendicular to one surface of the tunnel barrier layer.

When the magnetization direction of the magnetization free layer is parallel to the magnetization direction of the magnetization pinned layer, the variable resistance material pattern 144 may have a first resistance value. Meanwhile, when the magnetization direction of the magnetization free layer is semi-parallel to the magnetization direction of the magnetization pinned layer, the variable resistance material pattern 144 may have a second resistance value. The memory device 100 may store data by using the difference in resistance values. The magnetization direction of the magnetization free layer may be changed by spin torque of electrons in the program current.

The magnetization pinned layer and the magnetization free layer may include a magnetic material. In this case, the magnetization pinned layer may further include an antiferromagnetic material that pins the magnetization direction of the ferromagnetic material in the magnetization pinned layer. In an implementation, the tunnel barrier layer may include an oxide of Mg, Ti, Al, MgZn, or MgB.

In an implementation, as illustrated in FIGS. 2 and 3, each of the plurality of memory cells MC1 may have a rectangular column shape. In an implementation, the plurality of memory cells MC1 may have various shapes such as a cylinder, an oval pillar, and a polygonal pillar. In an implementation, an upper width of each of the plurality of memory cells MC1 may be the same as a lower width thereof, as illustrated in FIGS. 2 and 3, at least some portions of the plurality of memory cells MC1 may have a lower width greater than the upper width. In an implementation, a lower width of the variable resistance material pattern 144 (e.g., a width on a bottom surface of the variable resistance material pattern 144) may be greater than an upper width of the variable resistance material pattern 144 (e.g., a width on a top surface of the variable resistance material pattern 144). In an implementation, a lower width of the switching device 142 (e.g., a width on a bottom surface of the switching device 142) may be greater than an upper width of the switching device 142 (e.g., a width on a top surface of the switching device 142).

A first insulating layer 132 filling spaces between the plurality of first conductive lines 130 may be on the lower structure 120. Side walls of the plurality of memory cells MC1 may be covered by an insulating pattern 150. A second insulating layer 162 filling spaces between the plurality of second conductive lines 160 may be on the insulating pattern 150.

In an implementation, the first insulating layer 132, the insulating pattern 150, and the second insulating layer 162 may include silicon oxide, silicon nitride, or a combination thereof. In an implementation, air gaps or voids may be inside the insulating pattern 150. In an implementation, air gaps or voids may be formed inside the second insulating layer 162.

In an implementation, in order to form a cross point type memory device, a chalcogenide material layer having Ovonic threshold switching characteristics may be used as a switching device. The chalcogenide material layer may have a switching function after applying a high voltage thereto at an initial stage, and such a process for applying a high voltage at the initial stage may be referred to as a forming process or an initialization process. This forming process could randomly form a conductive path in the chalcogenide material layer, which may have disadvantages in terms of reliability, such as increased threshold voltage distribution or decreased durability of switching devices. In an implementation, process time or equipment for performing the forming process may be required, and manufacturing costs may be increased.

In an implementation, the switching device 142 of the memory device 100 may include lanthanum nickel oxide having a composition of $La_xNi_{1-x}O_y$, in which $0.13 \le x \le 0.30$ and $0.9 \le y \le 1.5$, which may have a NiO cubic structure and may exhibit Mott transition characteristics. Lanthanum nickel oxide with the above composition range may function as a switching device without a forming process, so it may have excellent reliability, such as relatively small threshold voltage distribution and improved durability, and the manufacturing cost of the memory device 100 may be reduced.

FIGS. 4 to 8 illustrate cross-sectional views of a memory device according to embodiments. In FIGS. 4 to 8, the same reference numerals as in FIGS. 1 to 3 denote the same components.

Figure 4:
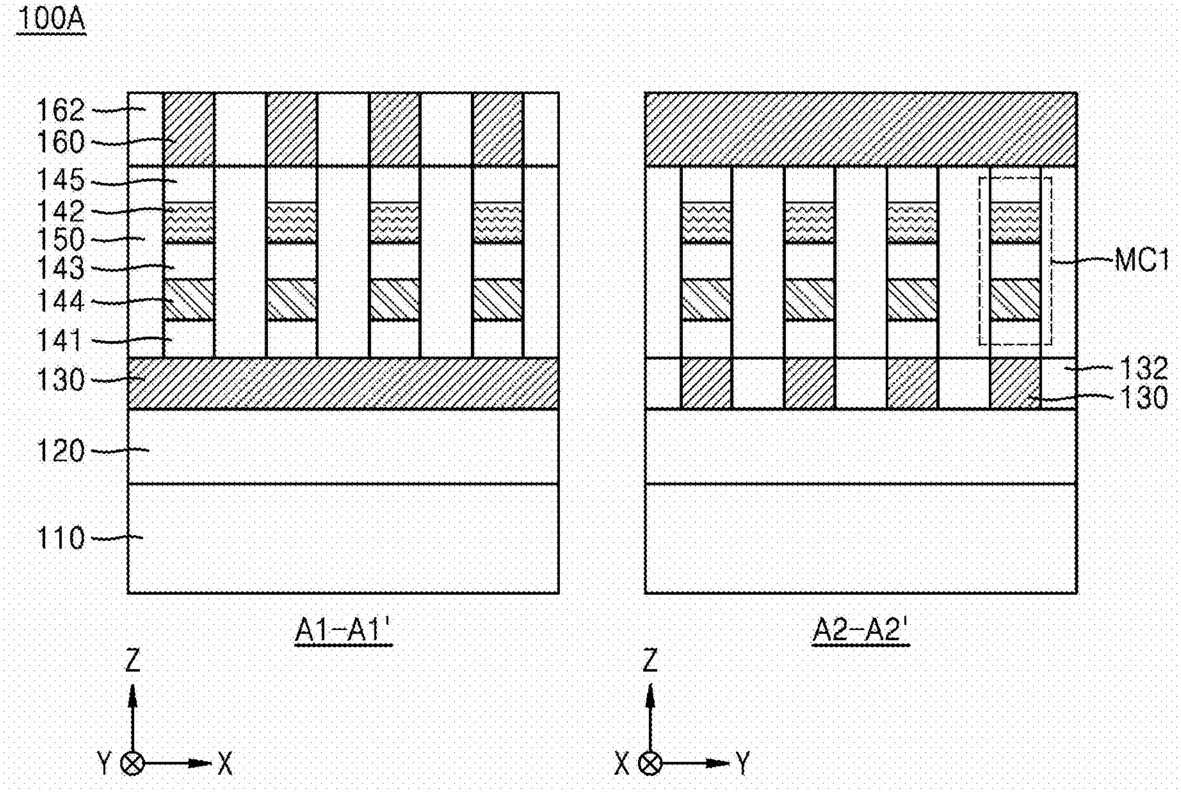
FIG. 4 illustrates cross-sectional views of a memory device according to embodiments.

In the memory device 100A illustrated in FIG. 4, each of the memory cells MC1 may include a first electrode 141, a variable resistance material pattern 144, a second electrode 143, a switching device 142, and a third electrode 145, which are sequentially stacked in a vertical direction Z. When compared with the memory device 100 described with reference to FIG. 3, the positions of the switching device 142 and the variable resistance material pattern 144 may be changed.

Figure 5:
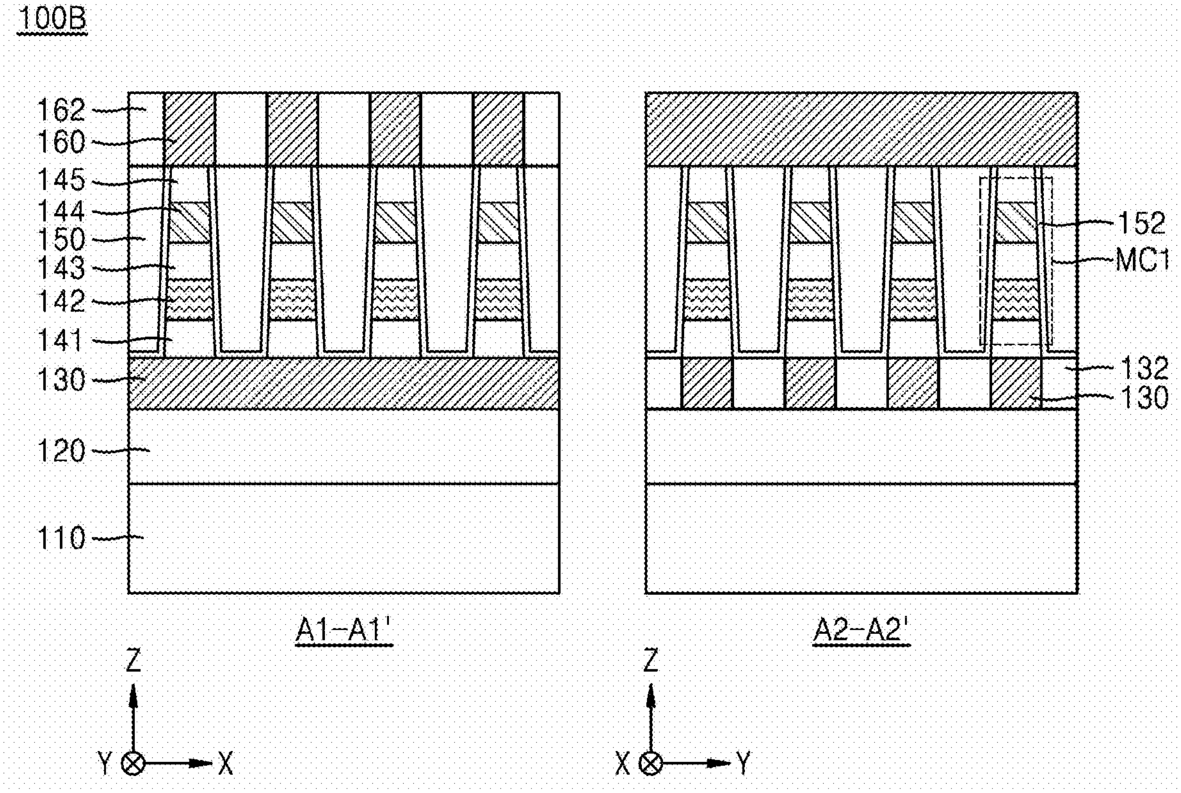
FIG. 5 illustrates cross-sectional views of a memory device according to embodiments.

In the memory device 100B shown in FIG. 5, the memory cells MC1 may have an inclined sidewall. In an implementation, the memory cells MC1 may have a sidewall inclined such that the width of the upper side thereof is smaller than the width of the lower side. The width of the top surface of the switching device 142 may be less than the width of the bottom surface thereof, and the width of the top surface of the variable resistance material pattern 144 may be less than the width of the bottom surface thereof. A spacer 152 may be between the inclined sidewall of each of the memory cells MC1 and the insulating pattern 150. The spacer 152 may be conformally in a space between two adjacent memory cells MC1, and a portion of the spacer 152 may be on a top surface of the first conductive line 130 and a top surface of the first insulating layer 132.

Figure 6:
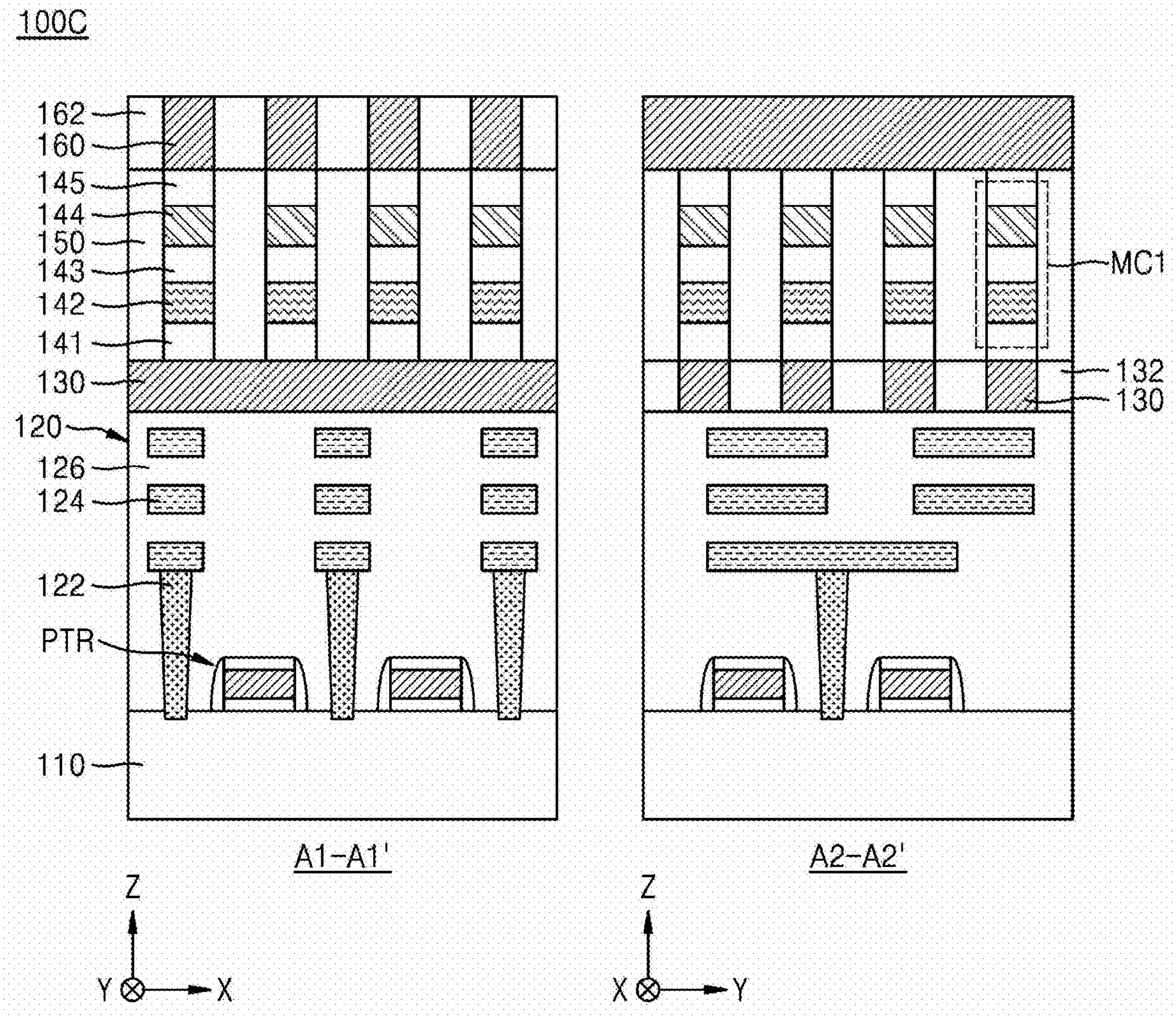
FIG. 6 illustrates cross-sectional views of a memory device according to embodiments.

The memory device 100C illustrated in FIG. 6 may have a cell over peripheral (COP) structure. In an implementation, the lower structure 120 may include peripheral circuits PTR, contacts 122, wiring layers 124, and interlayer insulating layers 126. The peripheral circuits PTR may be on the substrate 110, and the contacts 122 and the wiring layers 124 may be electrically connected to the peripheral circuits PTR. The interlayer insulating layers 126 may be on the substrate 110 and may cover the peripheral circuits PTR, the contacts 122, and the wiring layers 124. The first conductive lines 130, the memory cells MC1, and the second conductive lines 160 may be at positions vertically overlapping the peripheral circuits PTR.

Figure 7:
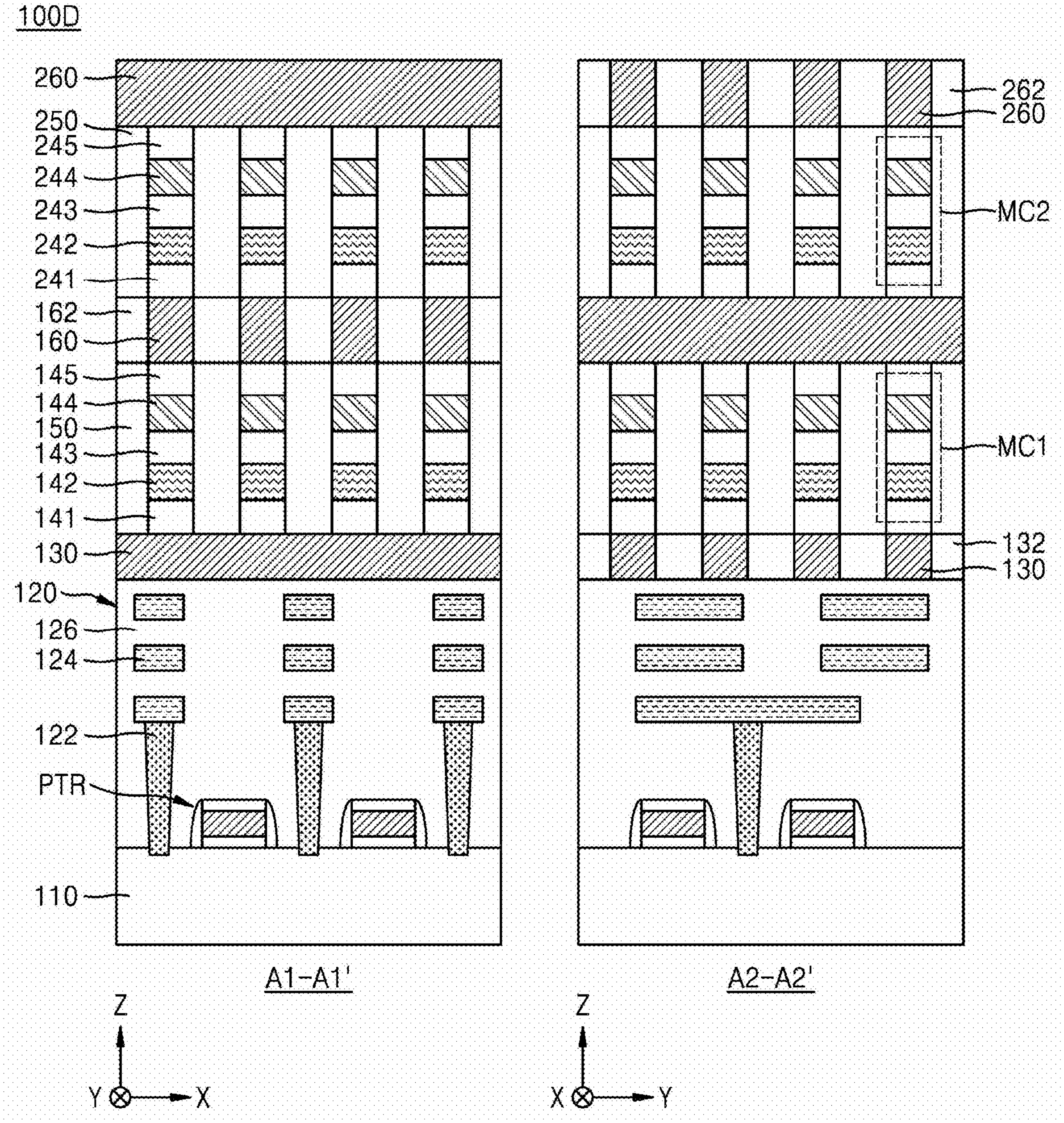
FIG. 7 illustrates cross-sectional views of a memory device according to embodiments.

The memory device 100D illustrated in FIG. 7 may have a cross point type two-layer stack structure. In an implementation, a plurality of first conductive lines 130 may be at a first vertical level on the lower structure 120, a plurality of second conductive lines 160 may be at a second vertical level higher than the first vertical level, and a plurality of third conductive lines 260 may be at the second vertical level higher than the second vertical level. A plurality of first memory cells MC1 may be arranged at the intersections of the plurality of first conductive lines 130 and the plurality of second conductive lines 160, respectively, and a plurality of second memory cells MC2 may be at the intersections of the plurality of second conductive lines 160 and the plurality of third conductive lines 260, respectively.

In an implementation, the plurality of first conductive lines 130 may correspond to first word lines, the plurality of second conductive lines 160 may correspond to common bit lines, and the plurality of third conductive lines 260 may correspond to second word lines. In an implementation, the plurality of first conductive lines 130 may correspond to first bit lines, the plurality of second conductive lines 160 may correspond to common word lines, and the plurality of third conductive lines 260 may correspond to second bit lines.

Each of the second memory cells MC2 may include a first electrode 241, a switching device 242, a second electrode 243, a variable resistance material layer 244, and a third electrode 245. Each of the first electrode 241, the switching device 242, the second electrode 243, the variable resistance material layer 244, and the third electrode 245 may have similar characteristics to the first electrode 141, the switching device 142, the second electrode 143, the variable resistance material pattern 144, and the third electrode 145 described with reference to FIGS. 2 and 3.

Figure 8:
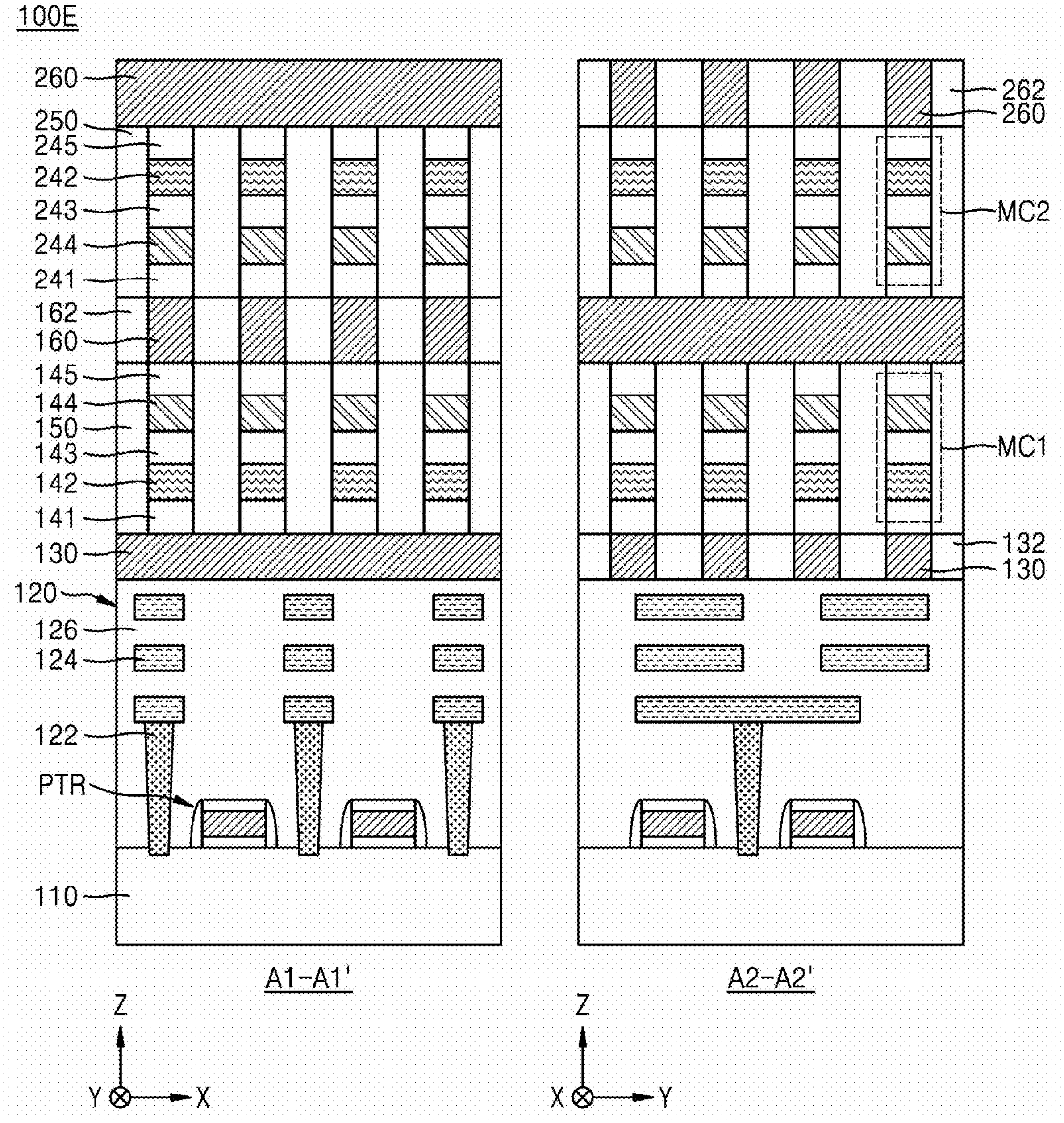
FIG. 8 illustrates cross-sectional views of a memory device according to embodiments.

In the memory device 100E illustrated in FIG. 8, each of the first memory cells MC1 may include a first electrode 141, a switching device 142, a second electrode 143, a variable resistance material pattern 144, and a third electrode 145, which are sequentially stacked in a vertical (Z) direction, and each of the second memory cells MC2 may include a first electrode 241, a variable resistance material layer 244, a second electrode 243, a switching device 242, and a third electrode 245, which are sequentially stacked in the vertical (Z) direction. Accordingly, the first memory cells MC1 and the second memory cells MC2 may be arranged in a symmetrical structure with respect to the second conductive line 160.

FIGS. 9 to 13 are cross-sectional views of stages in a method of manufacturing a memory device 100 according to embodiments.

Figure 9:
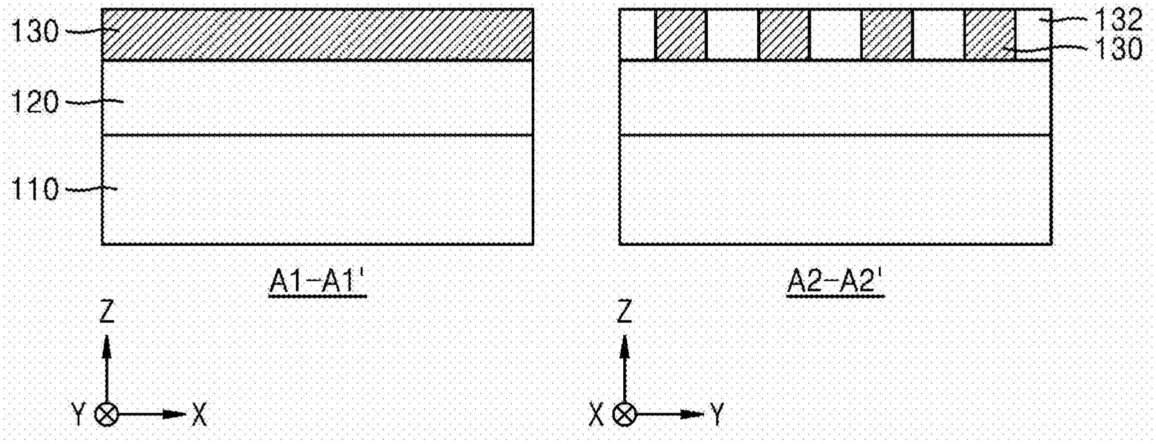
FIGS. 9 to 13 are cross-sectional views of stages in a method of manufacturing a memory device according to embodiments.

Referring to FIG. 9, a lower structure 120 may be formed on a substrate 110. A first conductive layer may be formed on the lower structure 120 and a plurality of first conductive lines 130 may be formed by patterning the first conductive layer. Thereafter, insulating layers may be formed on the plurality of first conductive lines 130 and the lower structure 120, and the upper portions of the insulating layers may be flattened until the top surfaces of the plurality of first conductive lines 130 are exposed to form first insulating layers 132.

Figure 10:
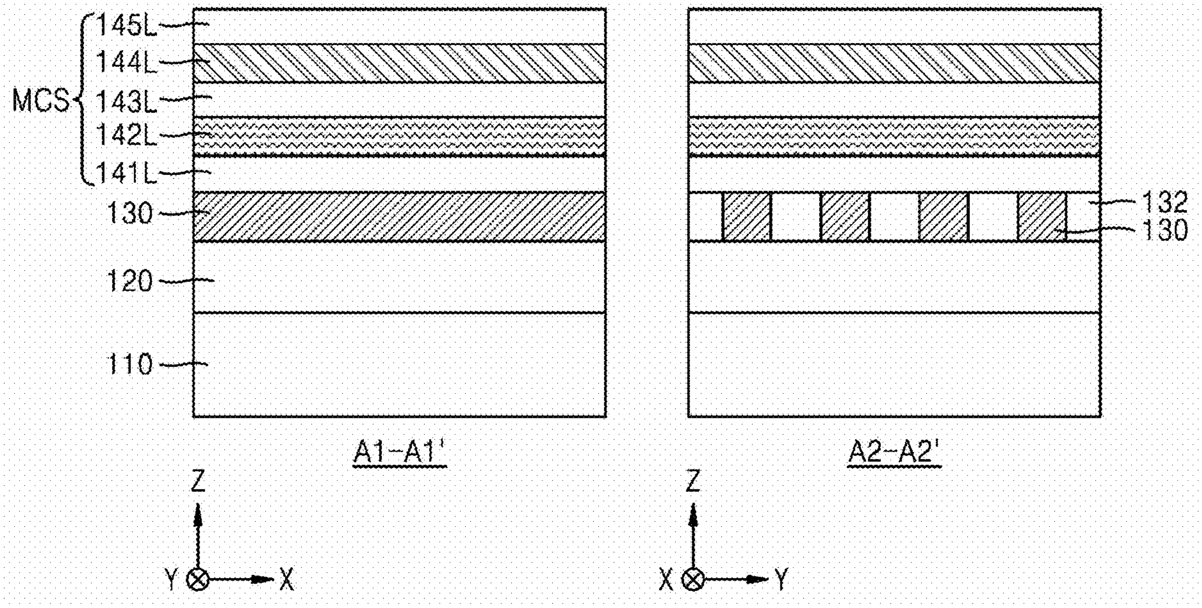

Referring to FIG. 10, a memory cell stack MCS sequentially including a first electrode material layer 141L, a switching material layer 142L, a second electrode material layer 143L, a variable resistance material layer 144L, and a third electrode material layer 145L may be formed on a plurality of first conductive lines 130 and a first insulating layers 132.

In an implementation, the process for forming the switching material layer 142L may include at least one of a physical vapor deposition (PVD) process or a chemical vapor deposition (CVD) process.

In an implementation, the switching material layer 142L may be formed by a sputtering process. In an implementation, an RF voltage of 180 W or a DC voltage of 50 W to 90 W may be applied to a solid phase target for forming a switching material layer in the sputtering process.

In an implementation, the switching material layer 142L may be formed by a reactive co-sputtering process using a nickel oxide target and a lanthanum target. In this case, the switching material layer 142L may be formed on the first electrode material layer 141L by applying RF voltage to the nickel oxide target, DC voltage to the lanthanum target, depositing nickel oxide from the nickel oxide target, on the first electrode material layer 141L and depositing lanthanum element from the lanthanum target.

In an implementation, in the process for forming the switching material layer 142L, a mixture of carrier gas (e.g., inert gas) and oxygen gas may be supplied into a reaction chamber, and a part of the oxygen gas may be used to maintain the stoichiometric ratio of the switching material layer 142L. In an implementation, a mixture gas in which the partial pressure of oxygen is maintained at 10% may be supplied into the reaction chamber. In an implementation, the reactive co-sputtering process may be performed at a temperature of about 300° C. to about 450° C.

In an implementation, the switching material layer 142L may be formed by a sputtering process using a lanthanum nickel oxide target with a predetermined composition ratio. In an implementation, the target may have a composition of $La_xNi_{1-x}O_y$, in which 0.13≤x≤0.30 and 0.9≤y≤1.5.

In an implementation, the first electrode material layer 141L, the second electrode material layer 143L, and the third electrode material layer 145L may be formed by a PVD process or a CVD process by using, e.g., W, Ti, Ta, Al, Cu, C, CN, TiN, TiAlN, TiSiN, TiCN, TiCSiN, WN, CoSiN, WSiN, TaN, TaCN, or TaSiN.

Figure 11:
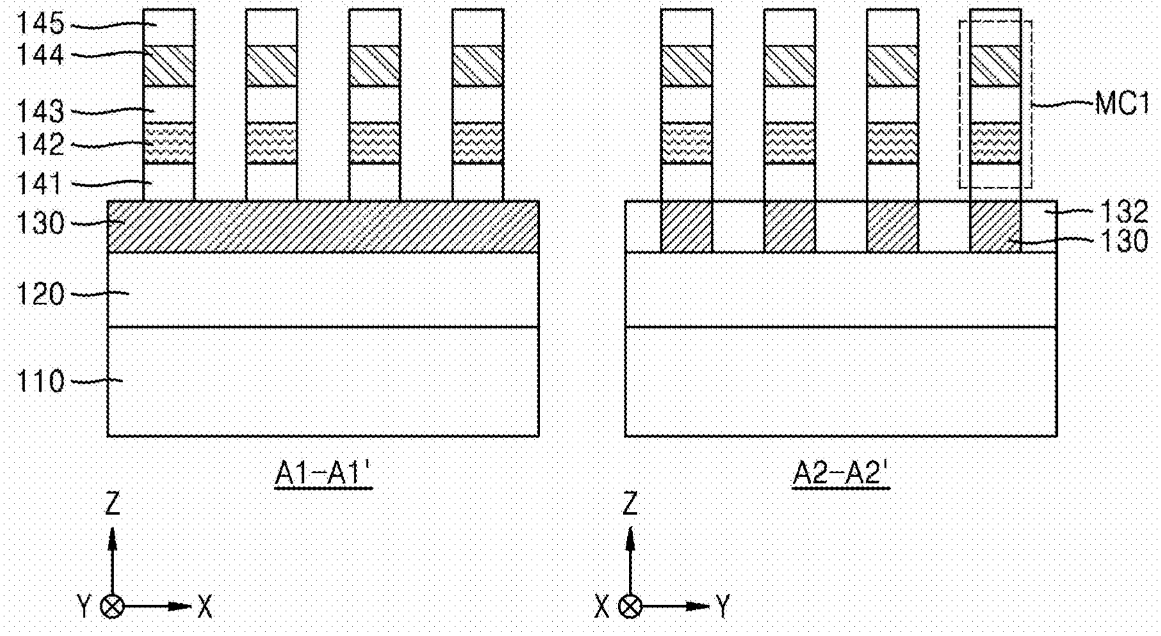

Referring to FIG. 11, each of memory cells MC1 including a first electrode 141, a switching device 142, a second electrode 143, a variable resistance material pattern 144, and a third electrode 145 may be formed by patterning the memory cell stack MCS.

In an implementation, an island type mask layer may be formed on the memory cell stack MCS, and the memory cell stack MCS may be patterned using the mask layer as an etching mask to form the memory cells MC1.

Figure 12:
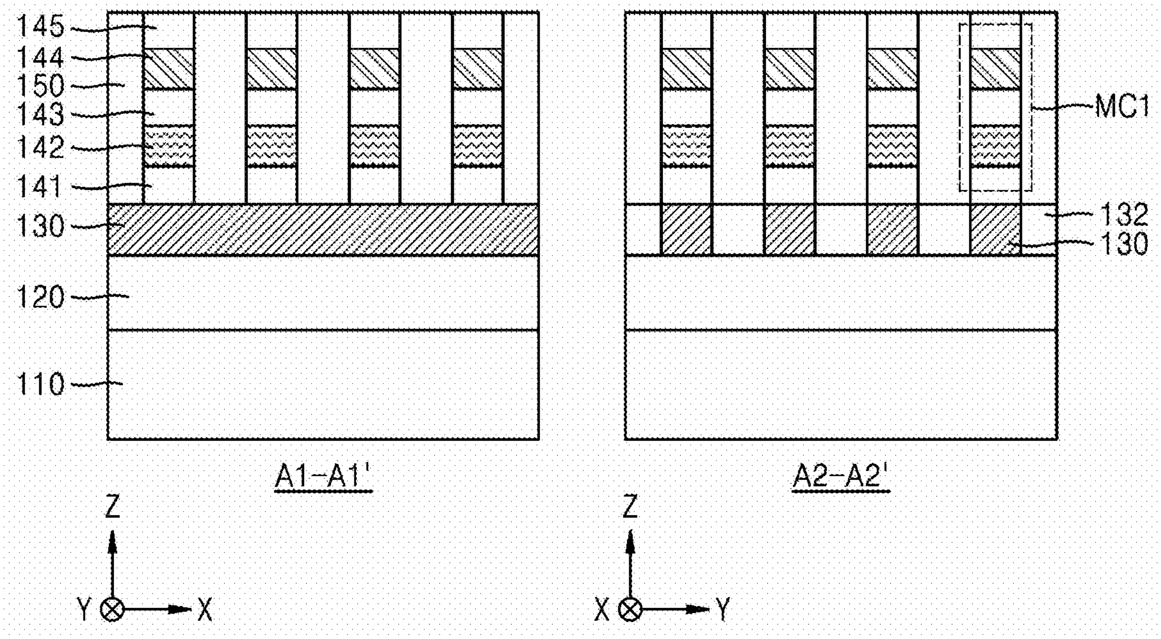

Referring to FIG. 12, an insulating layer covering a sidewall of each of the memory cells MC1 may be formed, and an upper part of the insulating layer may be planarized or etched back until a top surface of the third electrode 145 is exposed to form an insulating pattern 150.

Figure 13:
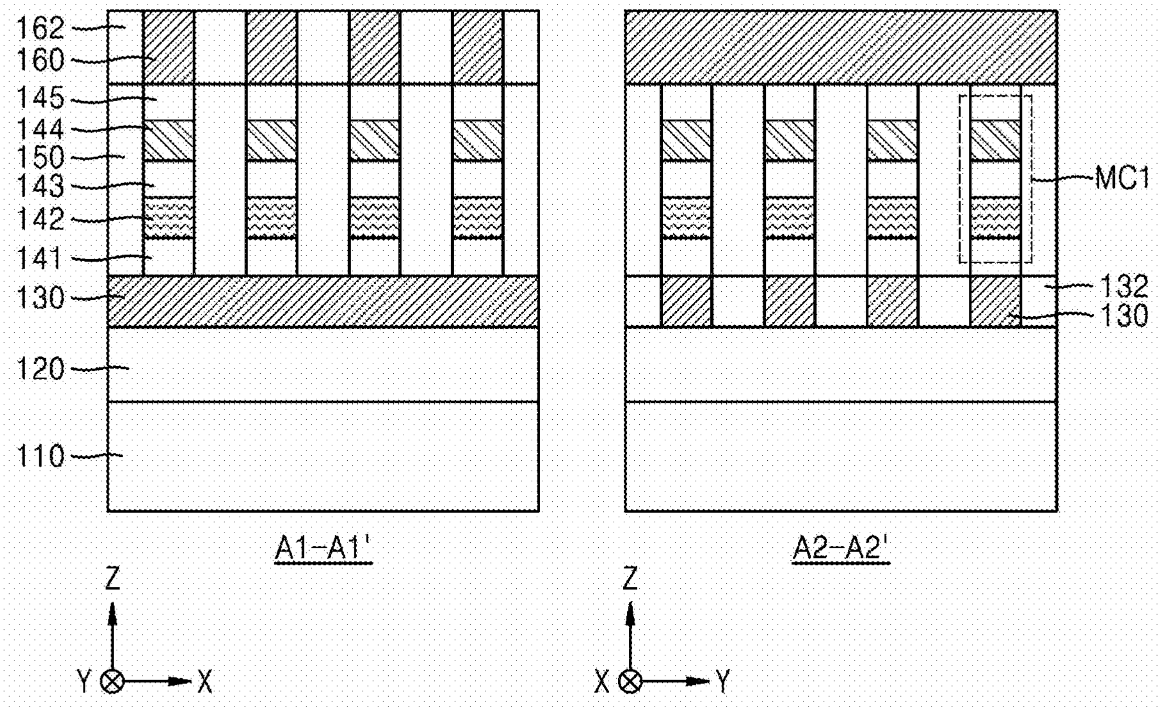

Referring to FIG. 13, a second conductive layer may be formed on the memory cells MC1 and the insulating pattern 150, and a plurality of second conductive lines 160 may be formed by patterning the second conductive layer. Thereafter, insulating layers may be formed on the plurality of second conductive lines 160, and the upper parts of the insulating layers may be planarized until top surfaces of the plurality of second conductive lines 160 are exposed to form second insulating layers 162.

The memory device 100 may be manufactured by the above-described process. The memory device 100 may not need a forming process for the switching device 142, and thus may have excellent reliability.

EXPERIMENTAL EXAMPLE

FIGS. 14 to 18C illustrate experimental results showing characteristics of a switching device according to Examples and Comparative Examples.

The switching devices in accordance with Comparative Example 1 (CO1) and Experimental Examples 1 to 3 (EX1, EX2, and EX3) were formed using the process conditions illustrated in Table 1 below.

TABLE 1

| | Process conditions | Composition |
|---|---|---|
| CO1 | NiO 180 W | $NiO_y$ |
| EX1 | NiO 180 W + La 50 W | $La_{0.13}Ni_{0.87}O_{1.13}$ |
| EX2 | NiO 180 W + La 70 W | $La_{0.18}Ni_{0.82}O_{0.91}$ |
| EX3 | NiO 180 W + La 90 W | $La_{0.30}Ni_{0.70}O_{1.15}$ |

Comparative Example 1 (CO1) was formed by a sputtering process using an RF voltage of 180 W using a NiO target, and Experimental Example 1 (EX1) was formed by a reactive co-sputtering process applying an RF voltage of 180 W to a NiO target and a DC voltage of 50 W to a La target by using the NiO target and the La target. Experimental Example 2 (EX2) and Experimental Example 3 (EX3) were performed under the same conditions as Experimental Example 1 (EX1), except that DC voltages of 70 W and 90 W were applied to La targets, respectively.

Figure 14:
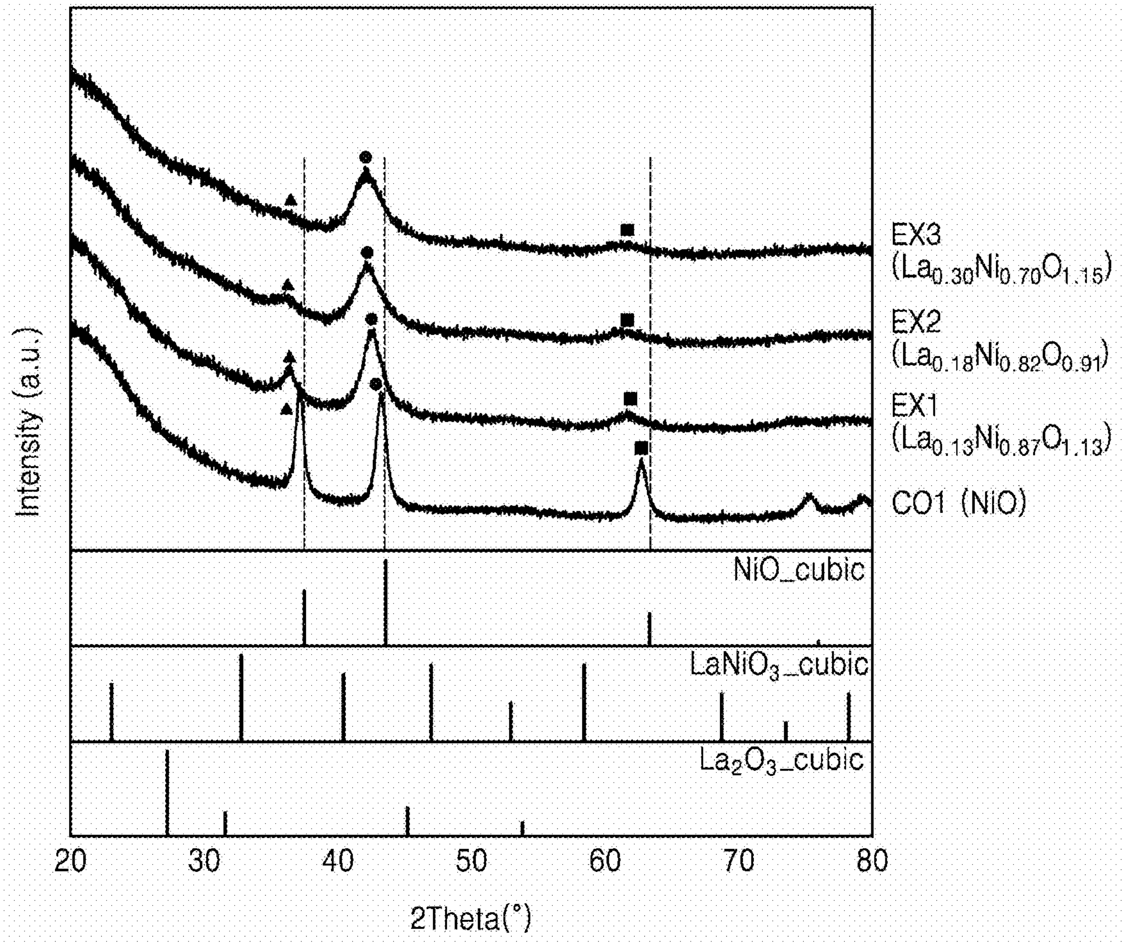
FIG. 14 is an X-ray diffraction analysis graph of a switching device according to embodiments.
Figure 15:
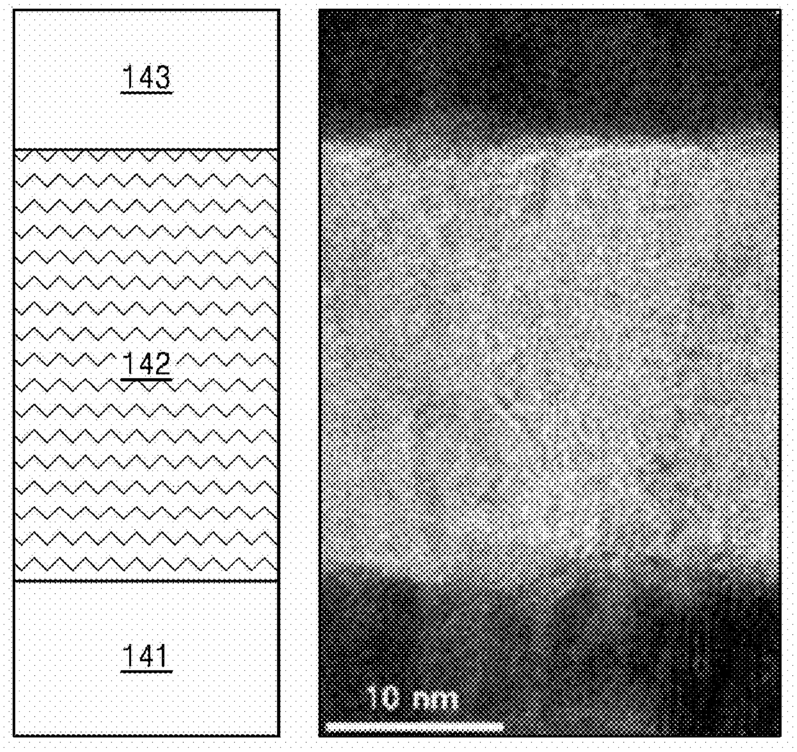
FIG. 15 illustrates a transmission electron microscopy (TEM) image of a switching device according to embodiments.

FIG. 14 is an X-ray diffraction analysis graph of a switching device according to embodiments. FIG. 15 illustrates a transmission electron microscopy (TEM) image of a switching device according to embodiments.

In FIGS. 14 and 15, the first electrode 141 and the second electrode 143 were formed using platinum (Pt), and a lanthanum nickel oxide layer having a thickness of about 20 nanometers as the switching device 142 was formed by the co-sputtering process as described above.

Referring to FIG. 14, the nickel oxide in accordance with Comparative Example 1 (CO1) had a Ni cubic structure, and had a (111) peak at 37.26±0.2°, a (200) peak at 43.29±0.2°, and a (220) peak at 62.88±0.2°. It may be seen that Experimental Example 1 (EX1), Experimental Example 2 (EX2), and Experimental Example 3 (EX3) all had (111) peaks at 37.26±0.2°, (200) peaks at 43.29±0.2°, and (220) peaks at 62.88±0.2°. Accordingly, it may be seen that all of Experimental Example 1 (EX1), Experimental Example 2 (EX2), and Experimental Example 3 (EX3) with a lanthanum content of 0.13 to 0.30 had a NiO cubic structure. In addition, it may be seen that none of Comparative Example (CO1), Experimental Example 1 (EX1), Experimental Example 2 (EX2), and Experimental Example 3 (EX3) had diffraction peaks derived from LaNiO3 cubic structures (e.g., perovskite structures) or lanthanum oxide ($La_2O_3$) cubic structures.

Referring to FIG. 15, the lanthanum nickel oxide layer according to Experimental Example 3 (EX3) did not form a separate material phase such as lanthanum oxide even if the lanthanum content is relatively large (e.g., lanthanum content is 0.3) and had a single material structure of lanthanum nickel oxide.

FIGS. 16A to 16D are voltage-current graphs illustrating switching behavior of a switching device according to embodiments.

Figure 16A:
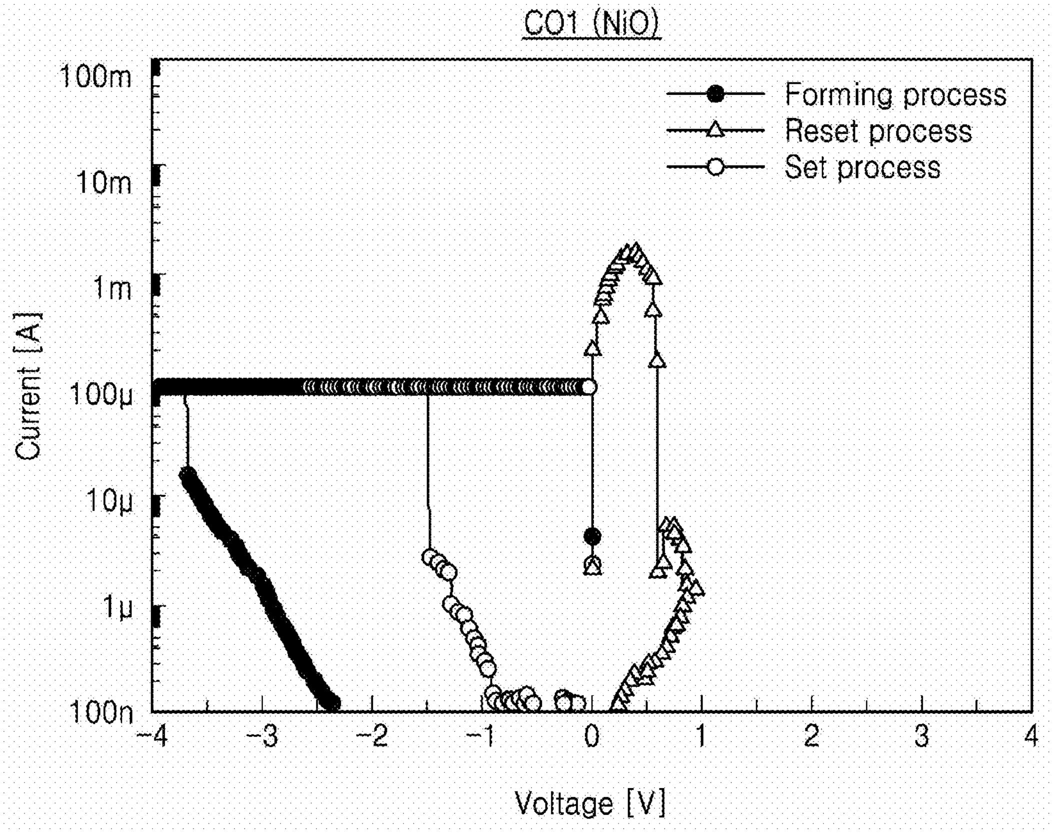
FIGS. 16A to 16D are voltage-current graphs illustrating switching behavior of a switching device according to embodiments.

Referring to FIG. 16A, the switching device according to Comparative Example 1 (CO1) needed to perform a forming process at a relatively high voltage (e.g., a forming voltage of −3 V), and after the forming process, as the magnitude of the applied voltage increased in a reset process and a set process, a current-current behavior that increased a current appeared. That is, it may be seen that a forming process was essential for the switching device according to Comparative Example 1 (CO1).

Figure 16B:
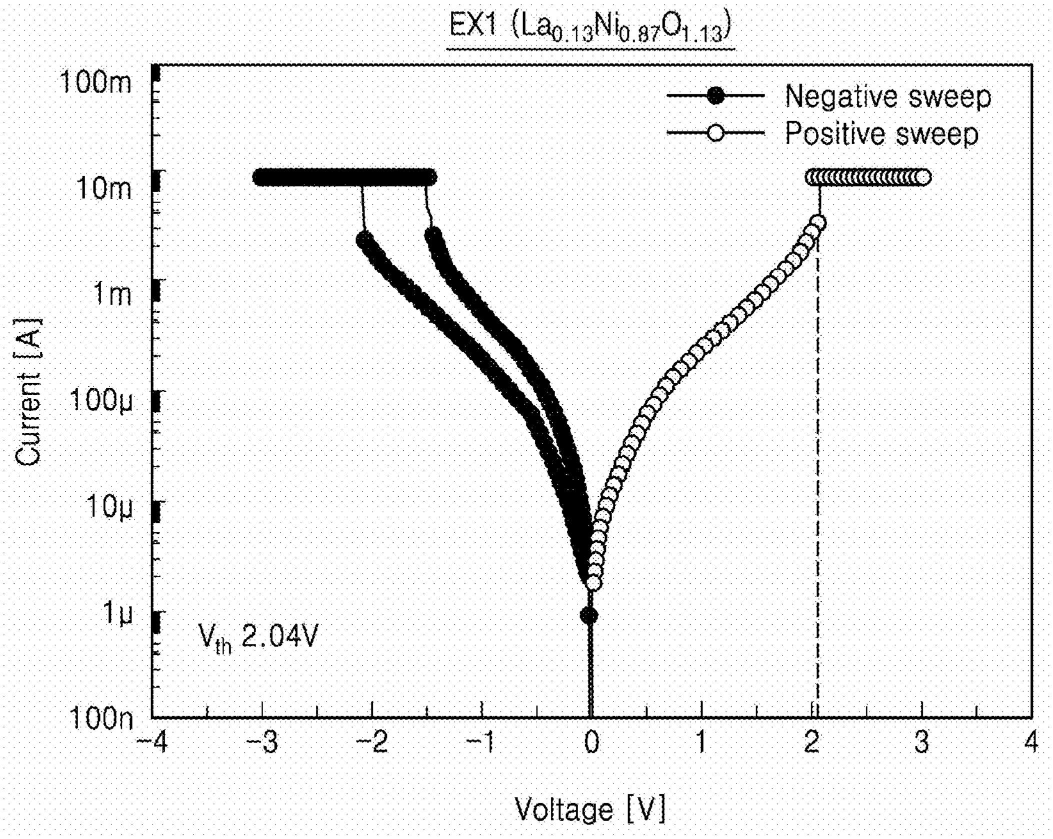

Referring to FIG. 16B, the switching device according to Experimental Example 1 (EX1) exhibited a current increase as the magnitude of the applied voltage increases in a positive sweep section, and had a current saturation value at a threshold voltage or more of about 2.04 V. Likewise, as the magnitude of the applied voltage increased in the negative sweep section, the current increased and had a current saturation value at the threshold voltage of approximately 2.04 V or higher. It may be seen that the switching device in accordance with Experimental Example 1 (EX1) exhibited a switching behavior in an initial voltage application cycle even without performing a separate forming process.

Figure 16C:
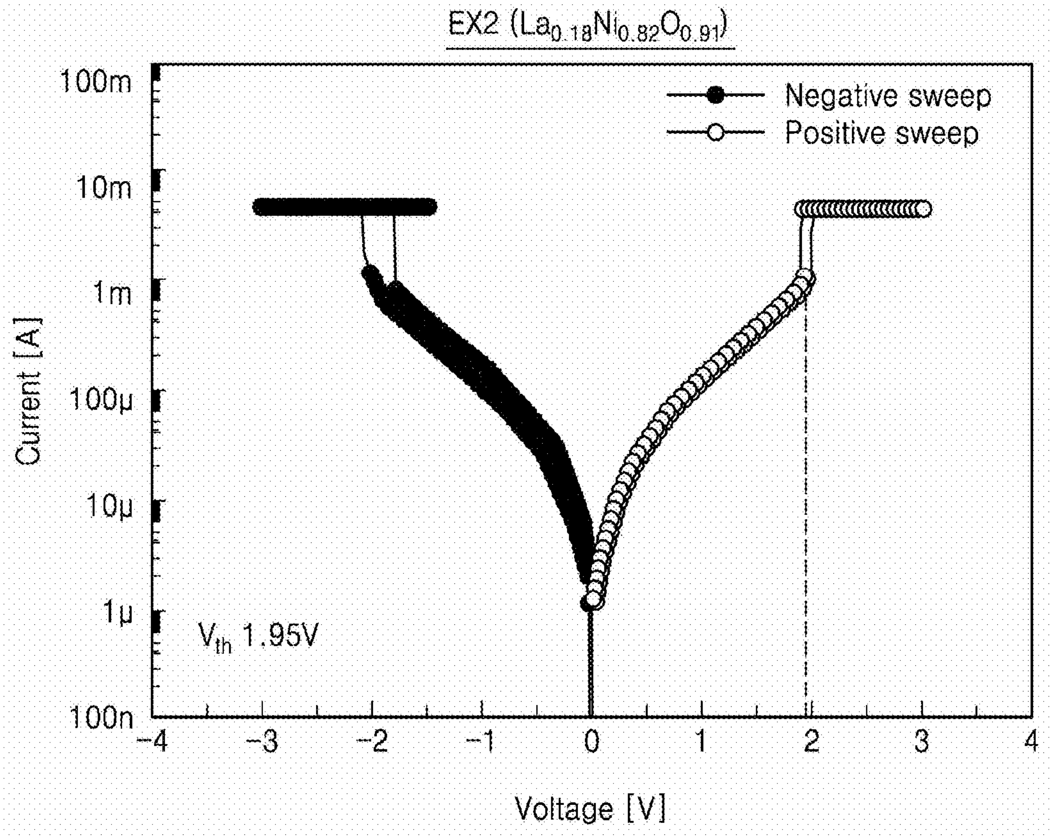

Referring to FIG. 16C, the switching device according to Experimental Example 2 (EX2) exhibited a current increase as the magnitude of the applied voltage increased in a positive sweep section, and had a current saturation value at a threshold voltage or more of about 1.95 V or more. Likewise, as the magnitude of the applied voltage increased in the negative sweep section, the current increased and had a current saturation value at the threshold voltage of approximately 1.95 V or higher. It may be seen that the switching device in accordance with Experimental Example 2 (EX2) exhibited a switching behavior in an initial voltage application cycle even without performing a separate forming process.

Figure 16D:
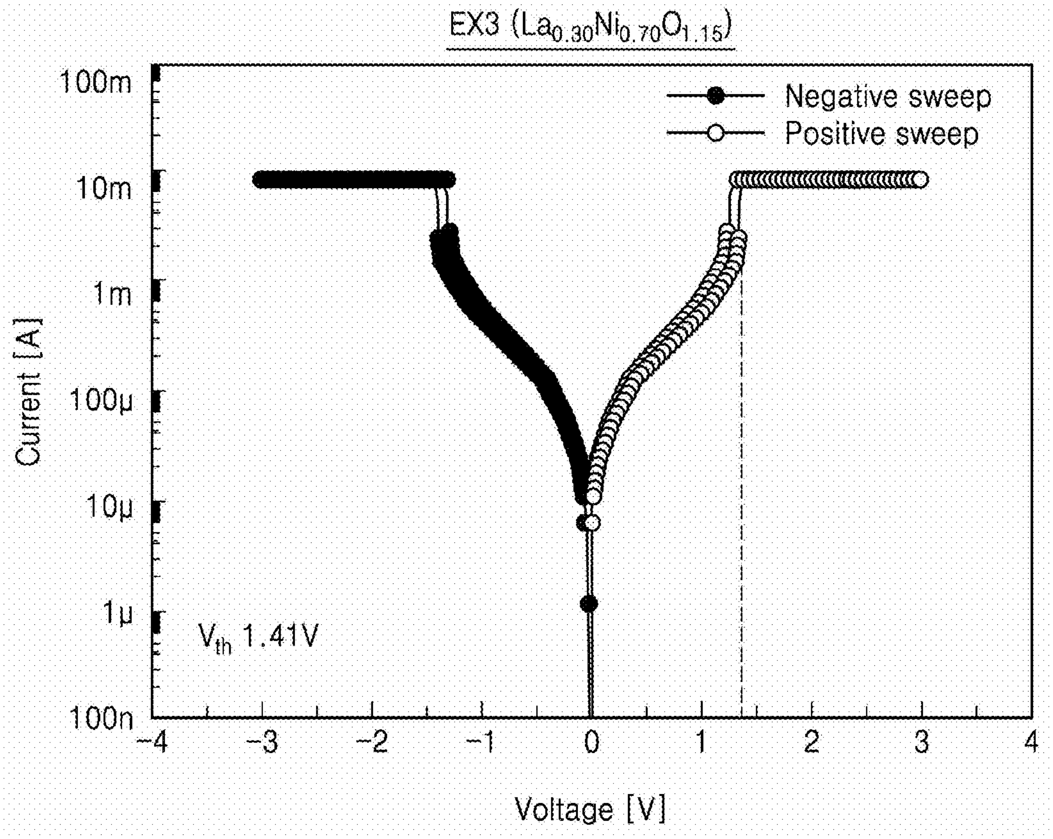

Referring to FIG. 16D, the switching device according to Experimental Example 3 (EX3) exhibited a current increase as the magnitude of the applied voltage increased in a positive sweep section, and had a current saturation value at a threshold voltage or more of about 1.41 V or more. Likewise, as the magnitude of the applied voltage increased in the negative sweep section, the current increased and had a current saturation value at the threshold voltage of approximately 1.41 V or higher. It may be seen that the switching device in accordance with Experimental Example 3 (EX3) exhibited a switching behavior in an initial voltage application cycle even without performing a separate forming process.

Figure 17:
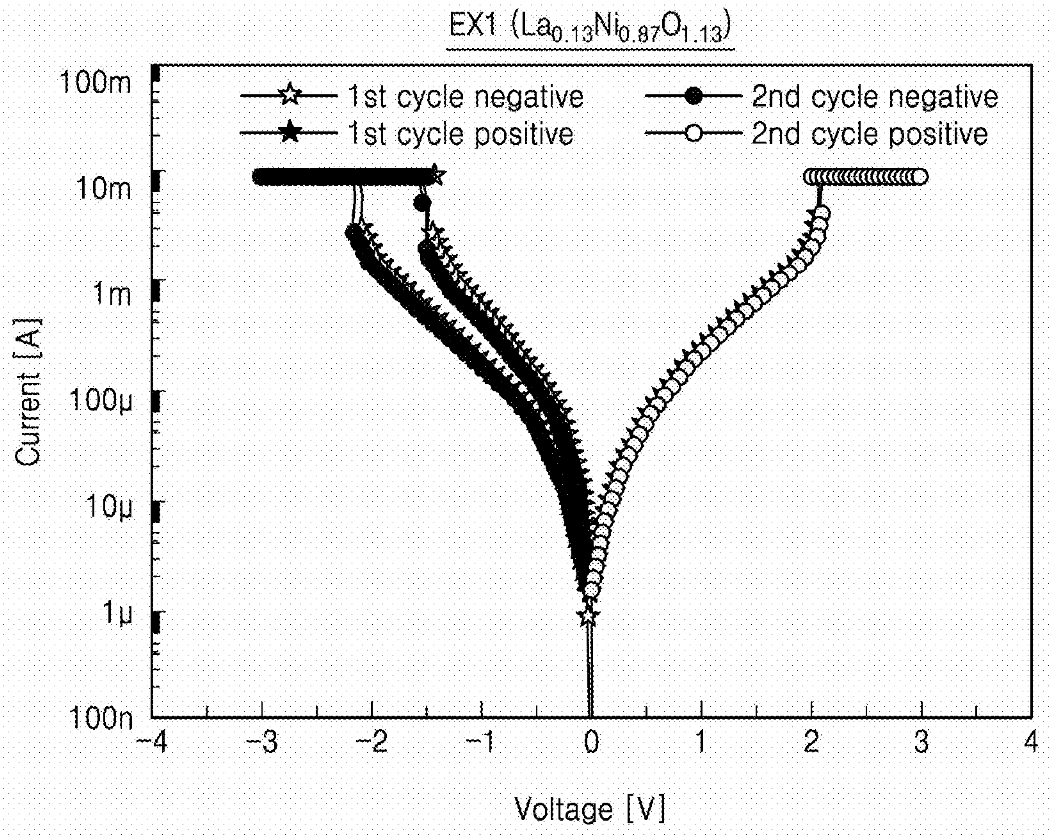
FIG. 17 is a graph showing switching characteristics of a first cycle and a second cycle of a switching device according to Experimental Example 1.

FIG. 17 is a graph showing switching characteristics of a first cycle and a second cycle of a switching device according to Experimental Example 1 (EX1).

Referring to FIG. 17, the negative sweep section of a first cycle and the negative sweep section of a second cycle had substantially the same or similar voltage-current profiles, e.g., the threshold voltage in the negative sweep section of the first cycle and the threshold voltage in the negative sweep section of the second cycle were the same. Likewise, the positive sweep section of a first cycle and the positive sweep section of a second cycle had substantially the same or similar voltage-current profiles, e.g., the threshold voltage in the positive sweep section of the first cycle and the threshold voltage in the positive sweep section of the second cycle were the same. Accordingly, it may be seen that the switching device according to Experimental Example 1 (EX1) exhibited stable switching characteristics even when a separate forming process was not performed.

Figure 18A:
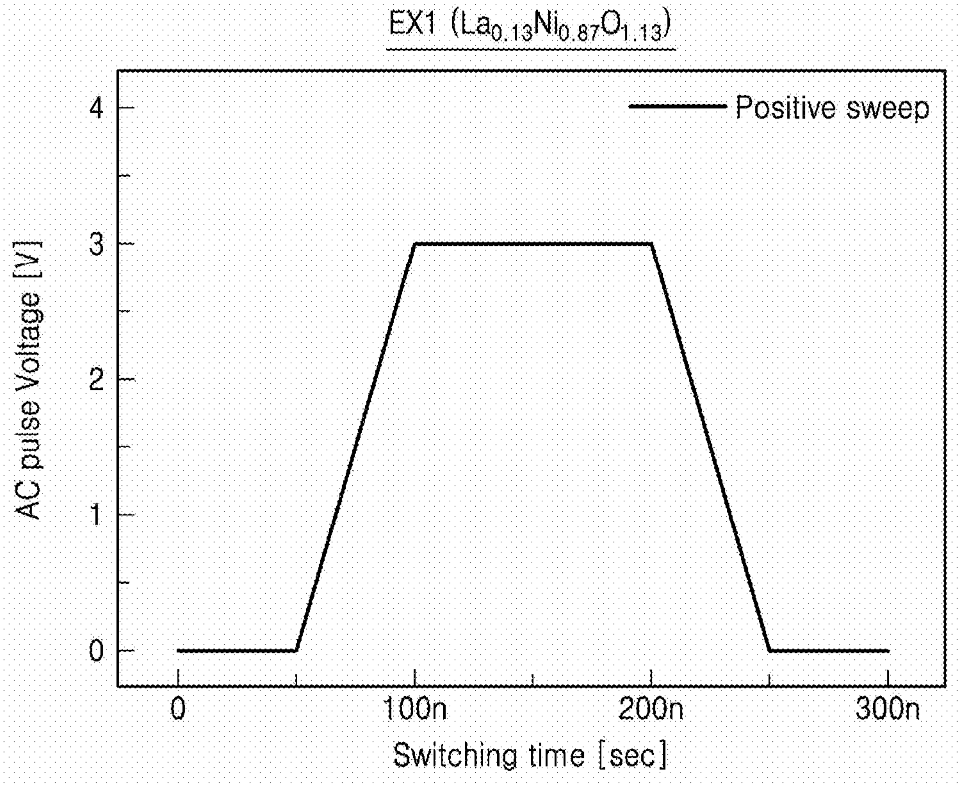
FIG. 18A is a graph illustrating an AC switching time of a switching device according to Experimental Example 1.
Figure 18B:
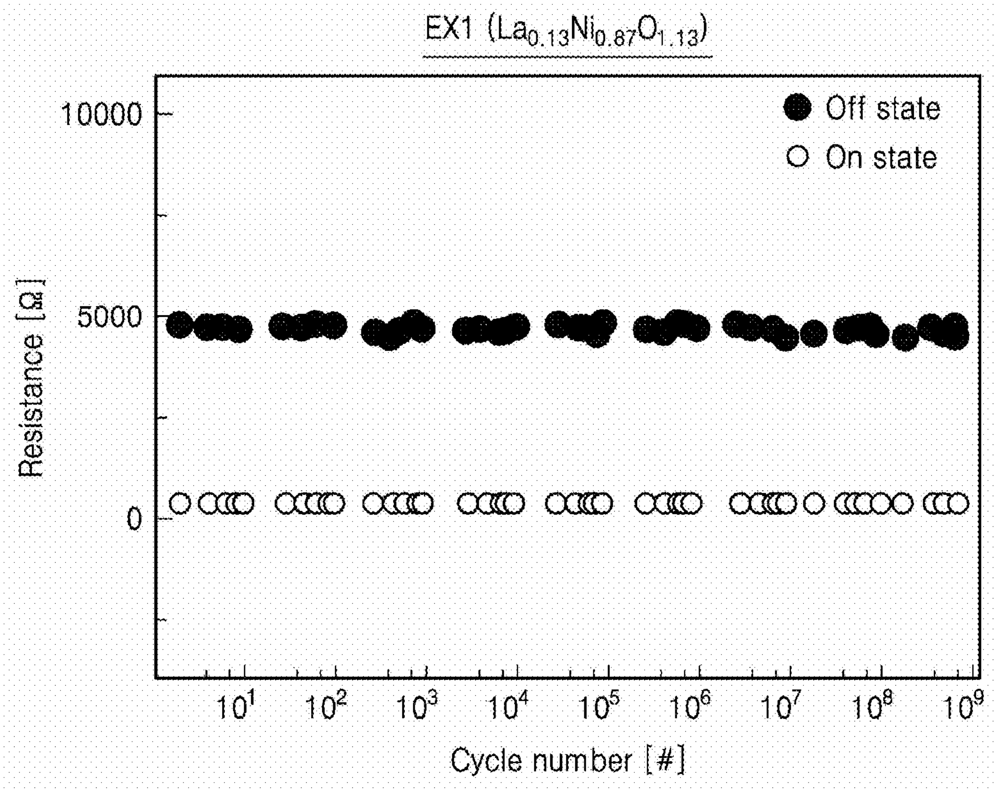
FIG. 18B is a graph showing durability of a switching device according to Experimental Example 1.
Figure 18C:
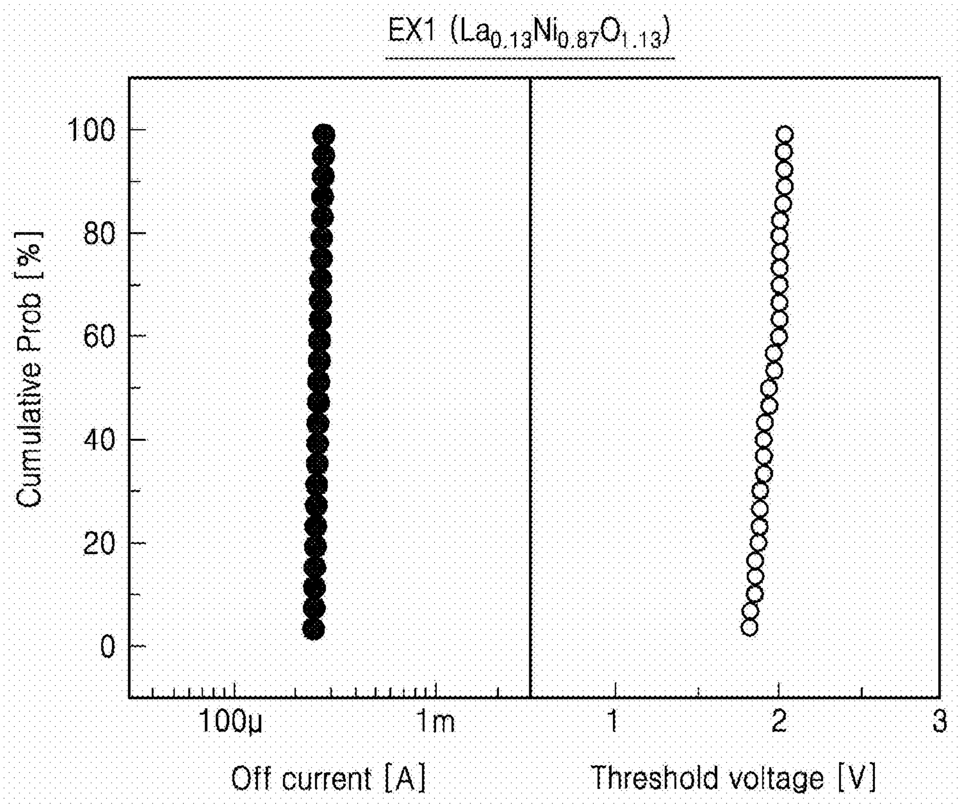
FIG. 18C is a graph showing off-current distribution and threshold voltage distribution of a switching device according to Experimental Example 1.

FIG. 18A is a graph illustrating an AC switching time of a switching device according to Experimental Example 1 (EX1), and FIG. 18B is a graph showing durability of a switching device according to Experimental Example 1 (EX1). FIG. 18C is a graph showing off-current distribution and threshold voltage distribution of a switching device according to Experimental Example 1 (EX1).

Referring to FIG. 18A, it may be seen that the switching device in accordance with Experimental Example 1 (EX1) exhibited a relatively short switching time (e.g., 200 nanoseconds) and had a fast switching speed.

Referring to FIG. 18B, it may be seen that the switching device according to Experimental Example 1 (EX1) was constantly maintained in the off-state resistance and the on-state resistance even after $10^9$-times cycles are performed. That is, it may be seen that the switching device according to Experimental Example 1 (EX1) had excellent durability.

Referring to FIG. 18C, it may be seen that the switching device in accordance with Experimental Example 1 (EX1) had a uniform off-current distribution and a uniform threshold voltage distribution.

As described above with reference to FIGS. 14 to 18C, it may be seen that the material of the switching device according to the Examples had a NiO cubic crystal structure in a composition range of $La_xNi_{1-x}O_y$, in which $0.13 \leq x \leq 0.30$ and $0.9 \leq y \leq 1.5$, and exhibited stable switching behavior even without a separate forming process. In addition, it may be seen that the switching device according to the Examples had a fast switching speed, a uniform off-current, and excellent durability.

By way of summation and review, a chalcogenide material with an Ovonic threshold switching characteristic may be used as a selection device used in the cross point structure. A random conductive path could be formed in a material layer of the selection device by a high voltage applied in the process of performing a first forming process, thereby degrading the reliability of the memory device.

One or more embodiments may provide a memory device having a cross point array structure.

One or more embodiments may provide a cross point type memory device that does not require a forming process and has excellent reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A memory device, comprising:
- a substrate;
- a plurality of first conductive lines on the substrate and extending in a first direction;
- a plurality of second conductive lines on the plurality of first conductive lines and extending in a second direction crossing the first direction; and
- a plurality of first memory cells respectively arranged between the plurality of first conductive lines and the plurality of second conductive lines, wherein:
- each first memory cell of the plurality of first memory cells includes a switching device and a variable resistance material pattern, and
- the switching device includes a non-perovskite material having a composition of $La_xNi_{1-x}O_y$, in which $0.13 \leq x \leq 0.30$ and $0.9 \leq y \leq 1.5$.

2. The memory device as claimed in claim 1, wherein the material of the switching device has a cubic crystal structure.

3. The memory device as claimed in claim 1, wherein the material of the switching device has a first peak at 37.26±0.2°, a second peak at 43.29±0.2°, and a third peak at 62.88±0.2° in an X-ray diffraction analysis graph.

4. The memory device as claimed in claim 3, wherein:
- the first peak is a peak derived from the (111) crystal plane of a NiO cubic crystal structure,
- the second peak is a peak derived from the (200) crystal plane of the NiO cubic crystal structure, and
- the third peak is a peak derived from the (220) crystal plane of the NiO cubic crystal structure.

5. The memory device as claimed in claim 1, wherein the material of the switching device has a Mott transition characteristic.

6. The memory device as claimed in claim 1, wherein:
the variable resistance material pattern includes a two-component material, a three-component material, a four-component material, or a five-component material, and
the variable resistance material pattern includes at least two of Ge, Se, Sb, Te, As, and Si.

7. The memory device as claimed in claim 1, wherein each first memory cell of the plurality of first memory cells includes:
a first electrode on the plurality of first conductive lines;
the switching device on the first electrode;
a second electrode on the switching device;
the variable resistance material pattern on the second electrode; and
a third electrode on the variable resistance material pattern.

8. The memory device as claimed in claim 7, wherein each of the first electrode, the second electrode, and the third electrode independently include W, Ti, Ta, Al, Cu, C, CN, TiN, TiAIN, TiSiN, TiCN, TiCSiN, WN, CoSiN, WSiN, TaN, TaCN, or TaSiN.

9. The memory device as claimed in claim 1, wherein each first memory cell of the plurality of first memory cells includes:
a first electrode on the plurality of first conductive lines;
the variable resistance material pattern on the first electrode;
a second electrode on the variable resistance material pattern;
the switching device on the second electrode; and
a third electrode on the switching device.

10. The memory device as claimed in claim 1, further comprising:
a spacer on a sidewall of the variable resistance material pattern included in each first memory cell of the plurality of first memory cells; and
an insulating pattern on sidewalls of two adjacent first memory cells among the plurality of first memory cells and covering the spacer.

11. The memory device as claimed in claim 1, wherein:
the variable resistance material pattern has an inclined sidewall, and
a width on a top surface of the variable resistance material pattern is less than a width on a bottom surface of the variable resistance material pattern.

12. The memory device as claimed in claim 1, further comprising:
a peripheral circuit under the plurality of first conductive lines on the substrate, the peripheral circuit being configured to drive the plurality of first memory cells; and
an insulating pattern surrounding sidewalls of each first memory cell of the plurality of first memory cells.

13. The memory device as claimed in claim 1, further comprising:
a plurality of third conductive lines on the plurality of second conductive lines and extending in the first direction; and
a plurality of second memory cells respectively between the plurality of second conductive lines and the plurality of third conductive lines,
wherein each second memory cell of the plurality of second memory cells includes a switching device and a variable resistance material pattern.

14. A memory device, comprising:
a substrate;
a plurality of first conductive lines on the substrate and extending in a first direction;
a plurality of second conductive lines on the plurality of first conductive lines and extending in a second direction crossing the first direction; and
a plurality of first memory cells respectively between the plurality of first conductive lines and the plurality of second conductive lines,
wherein:
each first memory cell of the plurality of first memory cells includes a switching device and a variable resistance material pattern, and
the switching device includes a non-perovskite material having a composition of $La_xNi_{1-x}O_y$, in which $0.13 \le x \le 0.30$ and $0.9 \le y \le 1.5$, and has a NiO cubic crystal structure.

15. The memory device as claimed in claim 14, wherein:
the material of the switching device has a first peak at 37.26±0.2°, a second peak at 43.29±0.2°, and a third peak at 62.88±0.2° in an X-ray diffraction analysis graph,
the first peak is a peak derived from the (111) crystal plane of the NiO cubic crystal structure,
the second peak is a peak derived from the (200) crystal plane of the NiO cubic crystal structure, and
the third peak is a peak derived from the (220) crystal plane of the NiO cubic crystal structure.

16. The memory device as claimed in claim 14, wherein:
the variable resistance material pattern includes a two-component material, a three-component material, a four-component material, or a five-component material, and
the variable resistance material pattern includes at least two of Ge, Se, Sb, Te, As, and Si.

17. The memory device as claimed in claim 14, wherein each first memory cell of the plurality of first memory cells includes:
a first electrode on the plurality of first conductive lines;
the switching device on the first electrode;
a second electrode on the switching device;
the variable resistance material pattern on the second electrode; and
a third electrode on the variable resistance material pattern.

18. The memory device as claimed in claim 14, further comprising:
a peripheral circuit under the plurality of first conductive lines on the substrate, the peripheral circuit being configured to drive the plurality of first memory cells; and
an insulating pattern surrounding sidewalls of each first memory cell of the plurality of first memory cells.

19. A memory device, comprising:
a substrate;
a peripheral circuit on the substrate;
a plurality of first conductive lines on the substrate at a first vertical level higher than a vertical level of the peripheral circuit and extending in a first direction;
a plurality of second conductive lines on the substrate at a second vertical level higher than the first vertical level, the plurality of second conductive lines extending in a second direction crossing the first direction; and a plurality of first memory cells respectively between the plurality of first conductive lines and the plurality of second conductive lines, wherein:

each first memory cell of the plurality of first memory cells includes a switching device and a variable resistance material pattern, and the switching device includes a non-perovskite material having a composition of $La_xNi_{1-x}O_y$, in which $0.13 \leq x \leq 0.30$ and $0.9 \leq y \leq 1.5$.

20. The memory device as claimed in claim 19, wherein each first memory cell of the plurality of first memory cells includes:

a first electrode between the switching device and the plurality of first conductive lines, a second electrode between the switching device and the variable resistance material pattern, and a third electrode between the variable resistance material pattern and the plurality of second conductive lines.

* * * * *